(12) United States Patent
Chai et al.

(10) Patent No.: US 11,930,658 B2
(45) Date of Patent: Mar. 12, 2024

(54) DISPLAY APPARATUS AND METHOD OF MANUFACTURING THE SAME

(71) Applicant: SAMSUNG DISPLAY CO., LTD., Yongin-si (KR)

(72) Inventors: Youngki Chai, Yongin-si (KR); Seonggeun Won, Yongin-si (KR); Kwanhee Lee, Yongin-si (KR); Youngji Kim, Yongin-si (KR); Yiseul Um, Yongin-si (KR); Younghoon Lee, Yongin-si (KR); Youngseo Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 48 days.

(21) Appl. No.: 17/330,618

(22) Filed: May 26, 2021

(65) Prior Publication Data
US 2022/0085326 A1 Mar. 17, 2022

(30) Foreign Application Priority Data
Sep. 14, 2020 (KR) ........................ 10-2020-0117773

(51) Int. Cl.
*H10K 50/844* (2023.01)
*H10K 50/80* (2023.01)
*H10K 71/00* (2023.01)

(52) U.S. Cl.
CPC ......... *H10K 50/844* (2023.02); *H10K 50/868* (2023.02); *H10K 71/00* (2023.02)

(58) Field of Classification Search
CPC ............. H01L 52/5281; H01L 52/5246; H01L 27/326; H10K 50/86; H10K 50/121; H10K 50/8426; H10K 59/353; H10K 59/50
See application file for complete search history.

(56) References Cited

U.S. PATENT DOCUMENTS

| | | | |
|---|---|---|---|
| 4,181,756 A * | 1/1980 | Fergason | .......... G02F 1/133528 427/163.1 |
| 8,467,177 B2 | 6/2013 | Mathew et al. | |
| 10,081,141 B2 | 9/2018 | Lee et al. | |
| 10,101,511 B2 | 10/2018 | Goto et al. | |
| 11,163,205 B1 * | 11/2021 | Li | .......... H05K 1/189 |
| 2016/0299272 A1 * | 10/2016 | Lee | ........ B23K 26/38 |

(Continued)

FOREIGN PATENT DOCUMENTS

| KR | 10-1197370 | 11/2012 |
|---|---|---|
| KR | 10-1706863 | 2/2017 |

(Continued)

*Primary Examiner* — Jay C Chang
(74) *Attorney, Agent, or Firm* — F. Chau & Associates, LLC

(57) ABSTRACT

A display apparatus includes a substrate including a main display area and a component area. The component area includes an auxiliary display area and a transmission area. Main display elements are disposed in the main display area. Auxiliary display elements are disposed in the component area. A thin-film encapsulation layer covers the main display elements and the auxiliary display elements. An optical functional layer is disposed on the thin-film encapsulation layer and includes a polarization layer. The polarization layer includes a first portion disposed in the transmission area and a second portion disposed in the main display area and the auxiliary display area.

23 Claims, 28 Drawing Sheets

(56) References Cited

U.S. PATENT DOCUMENTS

| | | | |
|---|---|---|---|
| 2017/0254939 A1* | 9/2017 | Lee | G02B 5/3033 |
| 2018/0095584 A1* | 4/2018 | Lee | G06F 3/0443 |
| 2018/0120489 A1 | 5/2018 | Yaegashi et al. | |
| 2018/0315357 A1 | 11/2018 | Nam et al. | |
| 2019/0096975 A1* | 3/2019 | Park | H10K 59/131 |
| 2020/0302878 A1* | 9/2020 | Kato | G02F 1/136286 |
| 2021/0005678 A1* | 1/2021 | Lee | H10K 77/111 |
| 2022/0238071 A1* | 7/2022 | Chen | G09G 3/3225 |

FOREIGN PATENT DOCUMENTS

| | | |
|---|---|---|
| KR | 10-2017-0055014 | 5/2017 |
| KR | 10-1828712 | 2/2018 |
| KR | 10-1980035 | 5/2019 |

* cited by examiner

DISPLAY APPARATUS AND METHOD OF MANUFACTURING THE SAME

CROSS-REFERENCE TO RELATED APPLICATION

This application claims priority under 35 U.S.C. § 119 to Korean Patent Application No. 10-2020-0117773, filed on Sep. 14, 2020, in the Korean Intellectual Property Office, the disclosure of which is incorporated by reference in its entirety herein.

1. Technical Field

One or more embodiments of the present inventive concepts relate to a display apparatus and a method of manufacturing the same, and more particularly, to a display apparatus, in which a display area is increased in order to display an image in an area, in which a component, which is an electronic element, is arranged, and a method of manufacturing the display apparatus.

2. Discussion of Related Art

The usage of display apparatuses has recently diversified. For example, display apparatuses have become thinner and lighter, and thus, the uses of display apparatuses have expanded.

As display apparatuses are used for various purposes, there may be various methods of designing shapes of display apparatuses, and functions which may be connected to or associated with display apparatuses have increased.

SUMMARY

One or more embodiments of the present inventive concepts include a display apparatus, in which a display area is increased in order to display an image in an area, in which a component, which is an electronic element, is arranged, and a method of manufacturing the display apparatus. However, these objectives are examples and do not limit the scope of the present inventive concepts.

Additional aspects will be set forth in part in the description which follows and, in part, will be apparent from the description, or may be learned by practice of embodiments of the present inventive concepts.

According to an embodiment of the present inventive concepts, a display apparatus includes a substrate including a main display area and a component area. The component area includes an auxiliary display area and a transmission area. Main display elements are disposed in the main display area. Auxiliary display elements are disposed in the component area. A thin-film encapsulation layer covers the main display elements and the auxiliary display elements. An optical functional layer is disposed on the thin-film encapsulation layer and includes a polarization layer. The polarization layer includes a first portion disposed in the transmission area and a second portion disposed in the main display area and the auxiliary display area.

The first portion may be bleached.

The first portion and the second portion each may include iodine, and a content of the iodine included in the first portion may be less than a content of the iodine included in the second portion.

The first portion and the second portion each may include boron, and a content of the boron included in the first portion may be less than a content of the boron included in the second portion.

A light transmittance of the first portion may be greater than a light transmittance of the second portion.

The optical functional layer may further include a protection layer arranged below the polarization layer.

The optical functional layer may further include a protection film arranged above the polarization layer.

The display apparatus may further include a bottom metal layer arranged on the component area and having a first hole corresponding to the transmission area.

According to an embodiment of the present inventive concepts, a display apparatus includes a substrate including a main display area and a component area. The component area includes a transmission area. A thin-film encapsulation layer covers the main display area and the component area. An optical functional layer is disposed on the thin-film encapsulation layer and includes a polarization layer. The polarization layer includes a first portion disposed in the transmission area and a second portion disposed in the main display area.

According to an embodiment of the present inventive concepts, a method of manufacturing a display apparatus includes forming a thin-film encapsulation layer on a substrate that includes a main display area and a component area. The component area includes an auxiliary display area and a transmission area. A polarization material layer is formed on the thin-film encapsulation layer. A photoresist layer is formed on the polarization material layer. A partial portion of the photoresist layer is exposed to light. A polarization layer is formed having a first portion disposed in the transmission area and a second portion disposed in the main display area and the auxiliary display area. The polarization layer is formed by developing the photoresist layer using a developing solution and by bleaching the first portion of the polarization material layer. An acid solution is applied onto the polarization layer.

The developing solution may include an alkaline material.

The first portion may be bleached via the developing solution.

The first portion and the second portion each may include iodine, and a content of the iodine included in the first portion may be less than a content of the iodine included in the second portion.

The first portion and the second portion each may include boron, and a content of the boron included in the first portion may be less than a content of the boron included in the second portion.

A light transmittance of the first portion may be greater than a light transmittance of the second portion.

The applying of the acid solution onto the polarization layer may include neutralizing the polarization layer.

According to an embodiment of the present inventive concepts, a method of manufacturing a display apparatus includes forming a thin-film encapsulation layer on a substrate including a main display area and a component area. The component area includes an auxiliary display area and a transmission area. A polarization material layer and a protection film are formed on the thin-film encapsulation layer. At least a partial portion of the protection film is removed by using a laser beam to form an opening in the protection film. A polarization layer is formed that includes a first portion disposed in the transmission area and a second portion disposed in the main display area and the auxiliary display area. The polarization layer is formed by applying an alkaline solution on the polarization material layer exposed by the opening. An acid solution is applied on the polarization layer.

The first portion may be bleached via the alkaline solution.

The first portion and the second portion each may include iodine, and a content of the iodine included in the first portion may be less than a content of the iodine included in the second portion.

The removing of the at least the portion of the protection film may include removing the at least the portion of the protection film, the at least the portion corresponding to the transmission area.

According to an embodiment of the present inventive concepts, a method of manufacturing a display apparatus includes forming a thin-film encapsulation layer on a substrate that includes a main display area and a component area. The component area includes a transmission area. A polarization material layer is formed on the thin-film encapsulation layer. A photoresist layer is formed on the polarization material layer. A partial portion of the photoresist layer is exposed to light. A polarization layer is formed that includes a first portion disposed in the transmission area and a second portion disposed in the main display area. The polarization layer is formed by developing the photoresist layer using a developing solution and by bleaching the first portion of the polarization material layer. An acid solution is applied onto the polarization layer.

According to an embodiment of the present inventive concepts, a display apparatus includes a substrate including a main display area and a component area. The component area includes a transmission area. An optical functional layer includes a polarization layer disposed on display elements disposed in the main display area. The polarization layer extends continuously on the main display area and the component area. The polarization layer includes a first portion that is bleached. The first portion is disposed in the transmission area.

BRIEF DESCRIPTION OF THE DRAWINGS

The above and other aspects, features, and advantages of certain embodiments of the present inventive concepts will be more apparent from the following description taken in conjunction with the accompanying drawings, in which.

DETAILED DESCRIPTION OF EMBODIMENTS

Figure 1A:
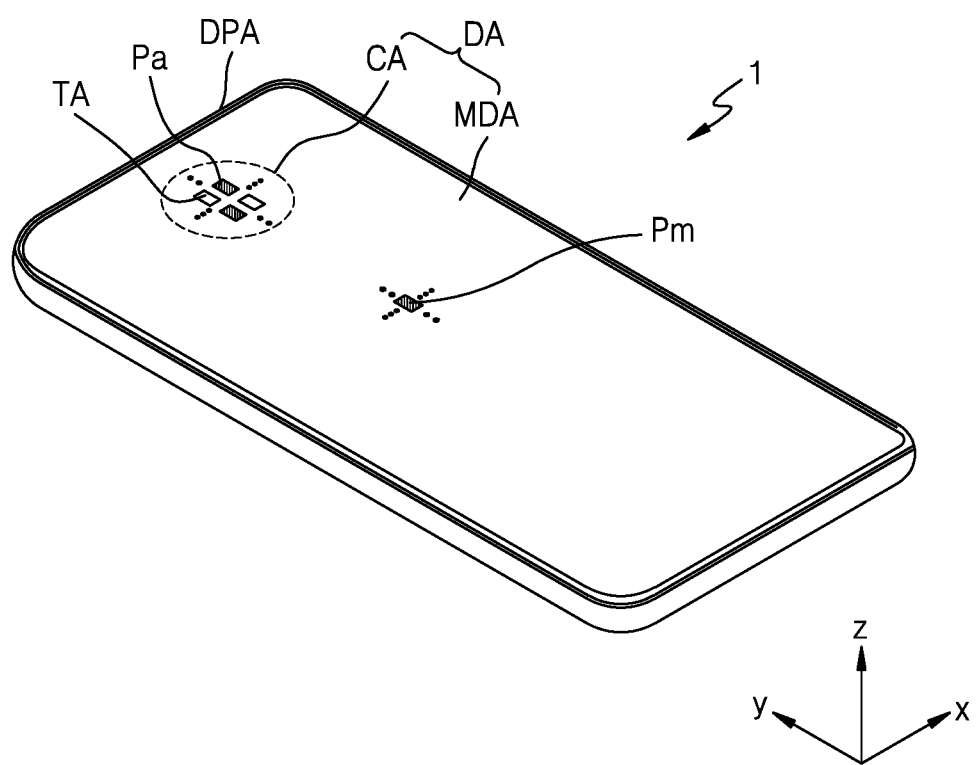
FIGS. 1A and 1B are perspective views of a display apparatus according to an embodiment of the present inventive concepts.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present inventive concepts. As used herein, the term "and/or" includes any and all combinations of one or more of the associated listed items. Throughout the disclosure, the expression "at least one of a, b or c" indicates only a, only b, only c, both a and b, both a and c, both b and c, all of a b, and c, or variations thereof.

While the present inventive concepts are capable of various modifications and alternative forms, embodiments thereof are shown by way of example in the drawings and will herein be described in detail. Effects and characteristics of the present inventive concepts, and realizing methods thereof will become apparent by referring to the drawings and embodiments described in detail below. However, the present inventive concepts are not limited to the embodiments disclosed hereinafter and may be realized in various forms.

It will be understood that although the terms "first," "second," etc. may be used herein to describe various components, these components should not be limited by these terms. These components are only used to distinguish one component from another.

As used herein, the singular expressions "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being formed "on" another layer, area, or element, it can be directly or indirectly formed on the other layer, region, or element. That is, for example, intervening layers, regions, or elements may be present. When a layer, region, or element is referred to as being formed "directly on" another layer, area, or element, no intervening layers, regions, or elements may be present.

Sizes of elements in the drawings may be exaggerated for convenience of explanation. For example, sizes and thicknesses of the elements in the drawings are randomly indicated for convenience of explanation, and thus, the present inventive concepts are not necessarily limited to the illustrations of the drawings.

In this specification, the expression "A and/or B" may indicate A, B, or A and B. Also, in this specification, the expression "at least one of A and B" may indicate A, B, or A and B.

In embodiments described hereinafter, "lines extending in a first direction or a second direction" denotes not only the lines extending as a linear shape, but also the lines extending in the first direction or the second direction as a zig-zag shape, a circular shape, etc.

In the embodiments hereinafter, the expression "planar" indicates a shape when an object is seen downwardly, and the expression "cross-sectional" indicates a shape when an object, which is vertically taken, is seen from the lateral perspective. In the embodiments below, when a part is referred to as "overlapping," the part may be "planarly" or "cross-sectionally" overlapping.

Hereinafter, embodiments of the present inventive concepts will be described in detail with reference to the accompanying drawings. Also, when the descriptions are given by referring to the drawings, the same elements or the corresponding elements will be referred to by using the same reference numerals.

Figure 1B:
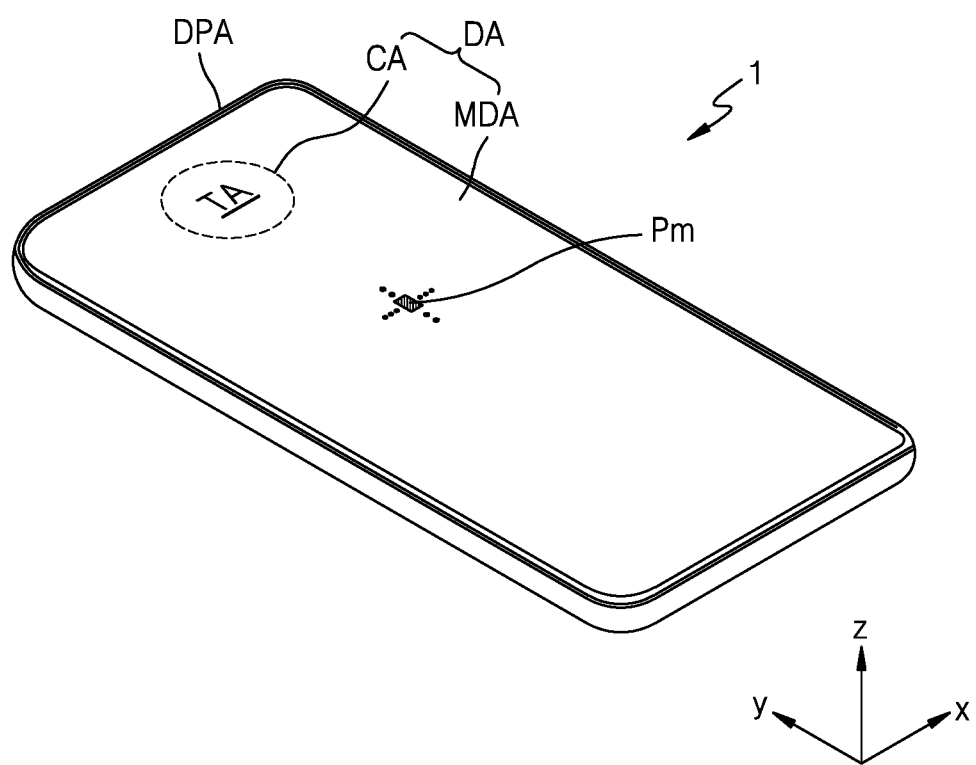

FIGS. 1A and 1B are schematic perspective views of a display apparatus 1 according to an embodiment of the present inventive concepts.

Referring to the embodiment of FIG. 1A, the display apparatus 1 may include a display area DA and a peripheral area DPA outside the display area DA. The display area DA may include a component area CA and a main display area MDA at least partially surrounding the component area CA (e.g., in the x and/or y directions). Each of the component area CA and the main display area MDA may separately or together display an image. The peripheral area DPA may be a non-display area in which display elements are not arranged and an image is no generated thereon. As shown in the embodiment of FIG. 1A, the display area DA may be entirely surrounded by the peripheral area DPA.

FIG. 1A illustrates that one component area CA is located in the main display area MDA. However, embodiments of the present inventive concepts are not limited thereto. For example, in an embodiment, the display apparatus 1 may include two or more component areas CA. In an embodiment, the two or more component areas CA may have different shapes and sizes from each other. When the component area CA is seen from a direction that is approximately perpendicular to an upper surface of the display apparatus 1 (e.g., in a plane defined in the x and y directions), the component area CA may have various shapes, such as a polygonal shape including a circular shape, an oval shape, a quadrangular shape, etc., a star shape, a diamond shape, etc. However, embodiments of the present inventive concepts are not limited thereto. Also, the embodiment of FIG. 1A illustrates that the component area CA is arranged at an upper center (e.g., in a +y direction) of the main display area MDA and the main display area MDA has a substantially quadrangular shape when seen from the direction approximately perpendicular to the upper surface of the display apparatus 1 (e.g., in a plane defined in the x and y directions). However, embodiments of the present inventive concepts are not limited thereto and the component area CA may be arranged at a side of the main display area MDA that has the quadrangular shape, such as an upper right side, an upper left side, etc.

The display apparatus 1 may provide an image by using a plurality of main sub-pixels Pm arranged in the main display area MDA and a plurality of auxiliary sub-pixels Pa arranged in the component area CA.

As described below with reference to the embodiment of FIG. 2, a component 40 is an electronic element that may be arranged below a display panel in the component area CA. In an embodiment, the component 40 may be a camera using infrared rays or visible rays and may include a capturing device. In an embodiment, the component 40 may include a solar battery, a flash device, an illuminance sensor, a proximity sensor, an iris sensor, etc. In an embodiment, the component 40 may have a function to receive sound. To prevent or limit the functions of the component 40 from being restricted, the component area CA may include a transmission area TA, through which light and/or sound may pass. The light and/or the sound may be output from the component 40 to the outside or may travel from the outside to the component 40. In the case of a display panel and a display apparatus including the display panel according to an embodiment, when light is transmitted through the component area CA, a light transmittance (e.g., transmittance of a spectrum of light encompassing visible light, ultraviolet light and/or infrared light) may be about 10% or greater. For example, in an embodiment, the light transmittance through the component area CA may be about 40% or greater, about 25% or greater, about 50% or greater, about 85% or greater, or about 90% or greater.

As shown in the embodiment of FIG. 1A, the plurality of auxiliary sub-pixels Pa may be arranged in the component area CA. The plurality of auxiliary sub-pixels Pa may emit light to generate an image. The image displayed in the component area CA may correspond to an auxiliary image, which may have a lower resolution than an image displayed in the main display area MDA. For example, when the component area CA includes the transmission area TA through which light and/or sound may be transmitted, and sub-pixels are not arranged in the transmission area TA, the number of auxiliary sub-pixels Pa arranged per unit area in the component area CA may be less than the number of main sub-pixels Pm arranged per unit area in the main display area MDA.

As shown in the embodiment of FIG. 1B, the auxiliary sub-pixels Pa may not be disposed in the component area CA. In embodiments in which the auxiliary sub-pixels Pa are not disposed in the component area CA, the transmission area TA may be increased, and thus, the component area CA may have increased light transmittance.

Figure 2:
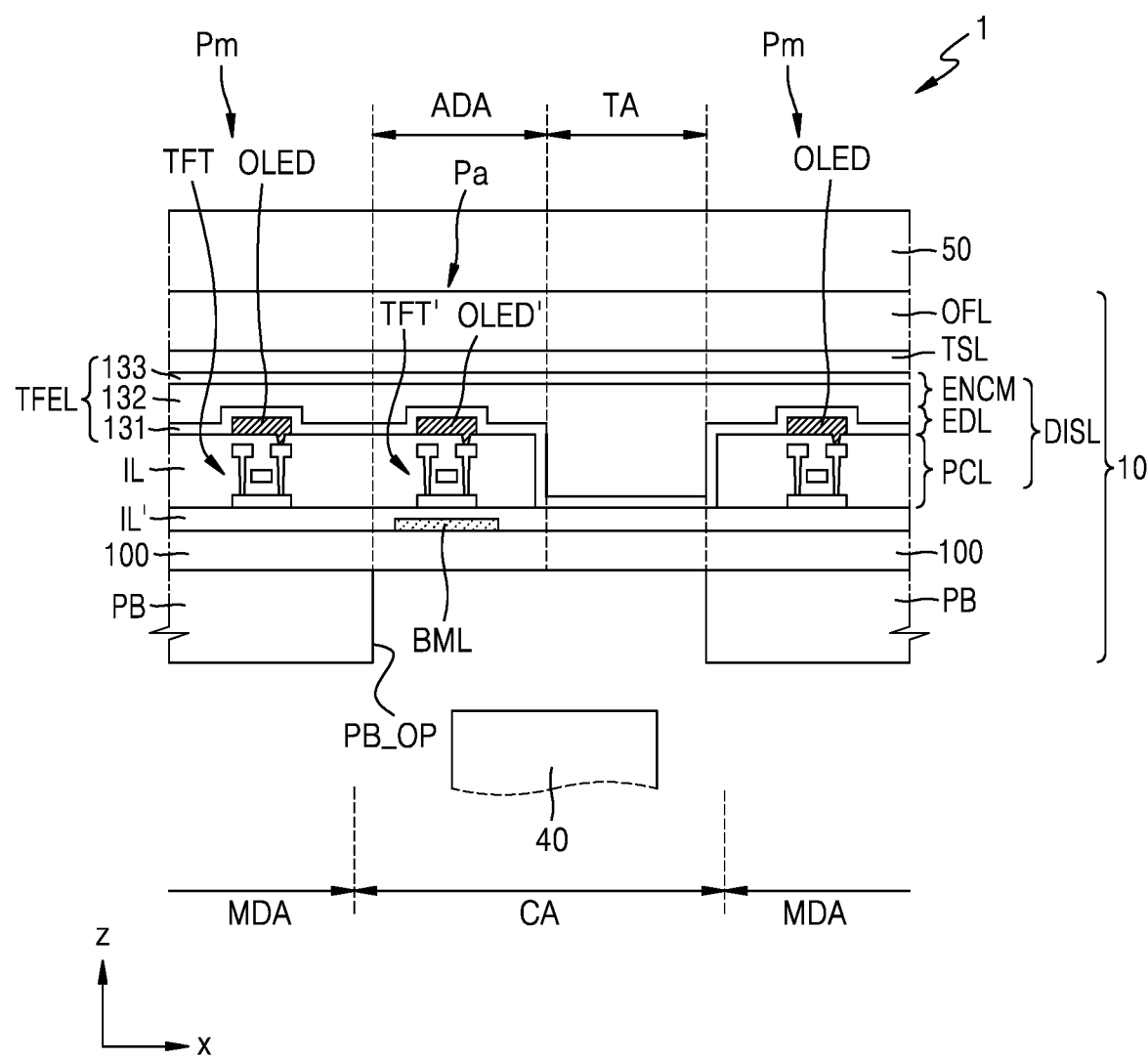
FIG. 2 is a cross-sectional view of a portion of a display apparatus according to an embodiment of the present inventive concepts.

FIG. 2 is a schematic cross-sectional view of a portion of the display apparatus 1 according to an embodiment of the present inventive concepts.

Referring to the embodiment of FIG. 2, the display apparatus 1 may include a display panel 10 and the component 40 disposed to overlap the display panel 10. The display apparatus 1 may include a cover window 50 disposed above the display panel 10.

The display panel 10 may include the component area CA, which is an area substantially overlapping the component 40 (e.g., overlapping in the z direction), and the main display area MDA in which a main image is displayed. The display panel 10 may include a substrate 100, a display layer DISL on the substrate 100, a touch screen layer TSL, an optical functional layer OFL, and a panel protection member PB disposed below the substrate 100.

The display layer DISL may include a circuit layer PCL including a main thin-film transistor TFT and an auxiliary thin-film transistor TFT', a display element layer EDL including a main organic light-emitting diode OLED and an auxiliary organic light-emitting diode OLED' that are display elements, and an encapsulation member ENCM, such as a thin-film encapsulation layer TFEL or an encapsulation substrate. Insulating layers, such as inorganic insulating layers IL and IL' may be arranged in the display layer DISL and between the substrate 100 and the display layer DISL, respectively.

In an embodiment, the substrate 100 may include an insulating material, such as at least one material selected from glass, quartz, and polymer resins. The substrate 100 may include a rigid substrate or a flexible substrate, which may be bent, folded, or rolled.

The main thin-film transistor TFT and the main organic light-emitting diode OLED connected thereto may be arranged in the main display area MDA of the display panel 10 to form the main sub-pixel Pm. The auxiliary thin-film transistor TFT' and the auxiliary organic light-emitting diode OLED' connected thereto may be disposed in the component area CA of the display panel 10 to form the auxiliary sub-pixel Pa. For example, an area of the component area CA in which the auxiliary sub-pixels Pa are disposed may be referred to as an auxiliary display area ADA. In an embodiment in which the auxiliary sub-pixels Pa are not disposed in the component area CA, the component area CA may not include the auxiliary display area ADA.

For example, the component area CA may include the transmission area TA which does not include display elements disposed thereon. The transmission area TA may be an area through which light/signals emitted from or incident on the component 40 disposed in the component area CA may pass. The auxiliary display area ADA and the transmission area TA may be alternately arranged in the component area CA. For example, as shown in the embodiment of FIG. 2, the auxiliary display area ADA and the transmission area TA may be arranged in the x direction. In an embodiment in which the display elements are not arranged in the component area CA, the component area CA may only include the transmission area TA.

A bottom metal layer BML may be disposed in the component area CA. The bottom metal layer BML may be arranged to overlap a lower portion of the auxiliary thin-film transistor TFT' (e.g., in the z direction). For example, the bottom metal layer BML may be disposed between the auxiliary thin-film transistor TFT' and the substrate 100 (e.g., in the z direction). The bottom metal layer BML may block external light from reaching the auxiliary thin-film transistor TFT'. In some embodiments, a constant voltage or signal may be applied to the bottom metal layer BML to prevent damage to a pixel circuit due to an electrostatic discharge. In an embodiment, the component area CA may include a plurality of the bottom metal layer BML arranged therein. Also, in an embodiment, different voltages may be applied to the bottom metal layers BML to prevent damage to a pixel circuit due to an electrostatic discharge. However, in an embodiment, the component area CA may include only one bottom metal layer BML that includes a hole disposed in the transmission area TA.

The display element layer EDL may be covered by the thin-film encapsulation layer TFEL or the encapsulation substrate. In some embodiments, the thin-film encapsulation layer TFEL may include at least one inorganic layer and at least one organic layer. For example, as shown in the embodiment of FIG. 2, the thin-film encapsulation layer TFEL may include a first inorganic layer 131, a second inorganic layer 133, and an organic layer 132 therebetween.

In an embodiment, the first and second inorganic layers 131 and 133 may include one or more inorganic insulating materials from among aluminum oxide, titanium oxide, tantalum oxide, hafnium oxide, zinc oxide, silicon oxide, silicon nitride, and silicon oxynitride. The organic layer 132 may include a polymer-based material. The polymer-based material may include an acryl-based resin, an epoxy-based resin, polyimide, polyethylene, etc.

In an embodiment in which the display element layer EDL is encapsulated by the encapsulation substrate, the encapsulation substrate may be arranged to face the substrate 100 with the display element layer EDL disposed between the encapsulation substrate and the substrate 100 (e.g., in the z direction). The encapsulation substrate and the display element layer EDL may have a gap therebetween. The encapsulation substrate may include glass. A sealant including frit, etc. may be disposed between the substrate 100 and the encapsulation substrate, and the sealant may be arranged in the peripheral area DPA described above. The sealant disposed in the peripheral area DPA may surround the display area DA and prevent the penetration of water through a side surface of the display area DA.

The touch screen layer TSL may obtain coordinate information based on an external input, such as a touch event, etc. In an embodiment, the touch screen layer TSL may include a touch electrode and touch lines connected to the touch electrode. The touch screen layer TSL may sense an external input based on a magnetic capacitance method or a mutual capacitance method.

In an embodiment, the touch screen layer TSL may be formed on the thin-film encapsulation layer TFEL. In another embodiment, the touch screen layer TSL may be separately formed on a touch substrate and then may be coupled onto the thin-film encapsulation layer TFEL through an adhesive layer, such as an optical clear adhesive (OCA). For example, the touch screen layer TSL may be formed directly above the thin-film encapsulation layer TFEL, and in this case, the adhesive layer may not be arranged between the touch screen layer TSL and the thin-film encapsulation layer TFEL.

The optical functional layer OFL may include a reflection prevention layer. The reflection prevention layer may reduce reflectivity of light (e.g., external light) that is incident toward the display apparatus 1 from the outside.

In a comparative embodiment, an opening may be formed in the optical functional layer OFL to increase the light transmittance of the transmission area TA. However, the optical functional layer OFL may be coupled onto the cover window 50 or the touch screen layer TSL via an adhesive, such as an OCA. Thus, when an inner portion of the opening of the optical functional layer OFL is not completely filled with the OCA, bubbles may be generated and thus affect the visibility.

According to an embodiment of the present inventive concepts, the optical functional layer OFL may not include an opening. The partial portion of the optical functional layer OFL that is disposed in the transmission area TA may be bleached. Thus, while the light transmittance of the transmission area TA may be increased due to the bleached portion of the optical functional layer OFL disposed in the transmission area TA, defects, due to bubbles, etc. may also be prevented.

The cover window 50 may be disposed above the display panel 10 to protect the display panel 10.

The optical functional layer OFL may be coupled onto the cover window 50 or the touch screen layer TSL via an OCA. The OCA may be applied to both an upper portion and a lower portion of the optical functional layer OFL. Alternatively, the OCA may not be applied to either one of the upper portion and the lower portion of the optical functional layer OFL.

The panel protection member PB may be coupled under the substrate 100 to support and protect the substrate 100. The panel protection member PB may include an opening PB_OP in the component area CA. When the panel protection member PB includes the opening PB_OP, the light transmittance of the component area CA may be increased. In an embodiment, the panel protection member PB may include polyethylene terephthalate or polyimide.

An area of the component area CA may be greater than an area of the component 40. Accordingly, an area of the opening PB_OP provided in the panel protection member PB may not correspond to the area of the component area CA. For example, as shown in the embodiment of FIG. 2, the area of the opening PB_OP provided in the panel protection member PB may be less than the area of the component area CA.

While the embodiment of FIG. 2 shows a single component 40 disposed in the component area CA, a plurality of components 40 may be disposed in the component area CA. The plurality of components 40 may have different functions from one another. For example, the plurality of components 40 may include at least two of a camera (e.g., an imaging device), a solar battery, a flash device, a proximity sensor, an illuminance sensor, and an iris sensor.

Figure 3:
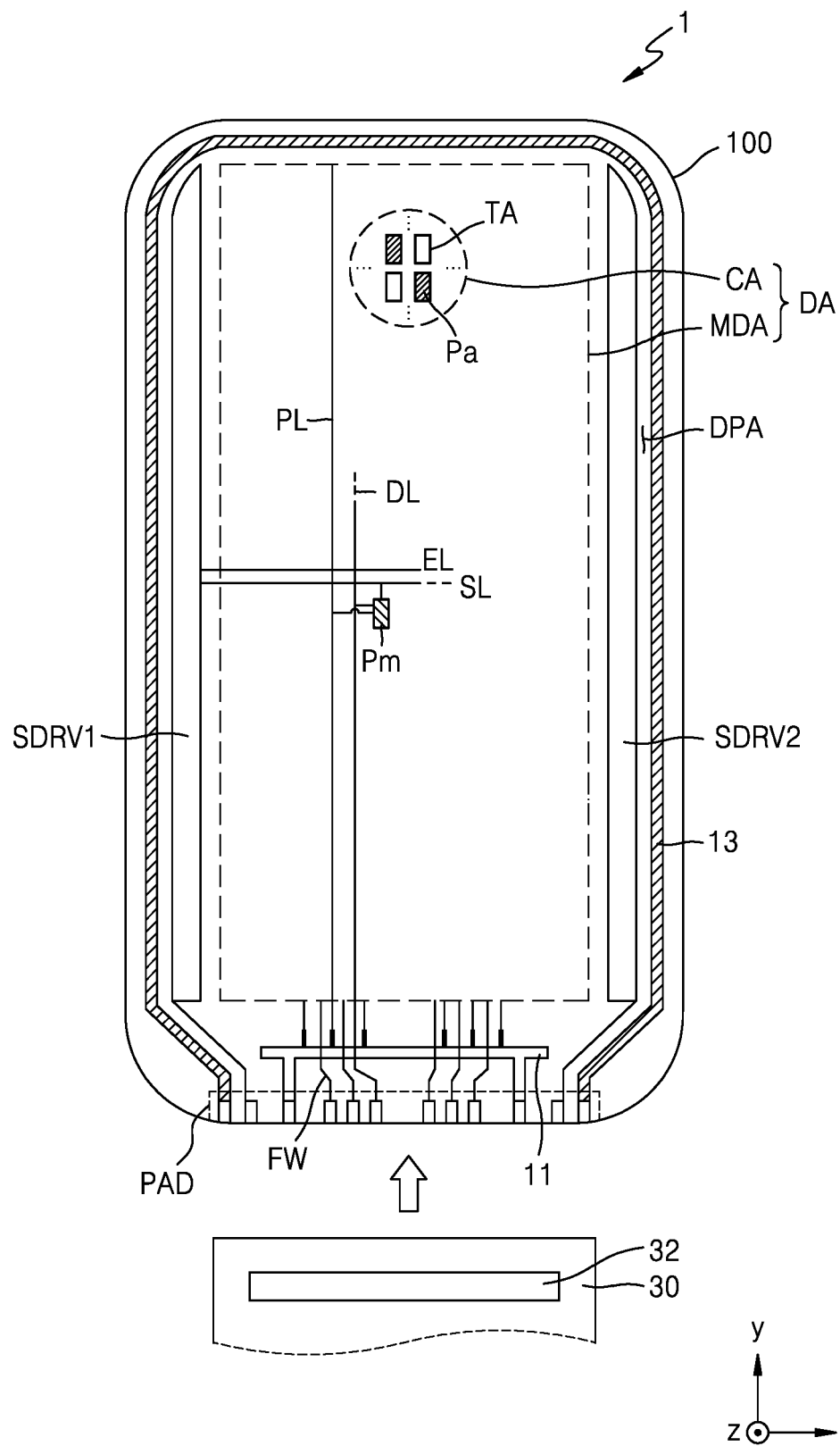
FIG. 3 is a plan view of a display apparatus according to an embodiment of the present inventive concepts.

FIG. 3 is a plan view of the display apparatus 1 according to an embodiment of the present inventive concepts.

Referring to the embodiment of FIG. 3, various components included in the display apparatus 1 may be disposed above the substrate 100. The substrate 100 may include the display area DA and the peripheral area DPA surrounding the display area DA. The display area DA may include the main display area MDA, in which a main image is displayed, and the component area CA, in which an auxiliary image is displayed. The component area CA includes the transmission area TA in which the auxiliary image is not displayed. The auxiliary image may form a portion of the main image or may be a separate image from the main image.

The plurality of main sub-pixels Pm may be arranged in the main display area MDA. Each of the main sub-pixels Pm may include a display element such as an organic light-emitting diode OLED. In an embodiment, each main sub-pixel Pm may emit, for example, red, green, blue, or white light. However, embodiments of the present inventive concepts are not limited thereto and the main sub-pixel Pm may emit various different colors. The main display area MDA may be covered by an encapsulation member and may be protected from external air, moisture, etc.

The component area CA may be located at a side of the main display area MDA as described above, or may be arranged in the display area DA and surrounded by the main display area MDA.

For example, the plurality of auxiliary sub-pixels Pa may be arranged in the component area CA. Each of the auxiliary sub-pixels Pa may include a display element such as an organic light-emitting diode OLED. Each auxiliary sub-pixel Pa may emit, for example, red, green, blue, or white light. However, embodiments of the present inventive concepts are not limited thereto and the auxiliary sub-pixels Pa may emit various different colors. The component area CA may be covered by an encapsulation member and may be protected from external air, moisture, etc. In another embodiment, the auxiliary sub-pixels Pa may not be disposed in the component area CA. In embodiments in which the auxiliary sub-pixels Pa are not disposed in the component area CA, the light transmittance of the component area CA may be increased.

The component area CA may have the transmission area TA. The transmission area TA may be arranged to surround the plurality of auxiliary sub-pixels Pa. In another embodiment, the transmission area TA may be arranged to have a grid shape with respect to the plurality of auxiliary sub-pixels Pa.

Since the component area CA has the transmission area TA which does not include auxiliary sub-pixels Pa, a resolution of the component area CA may be lower than a resolution of the main display area MDA. For example, in an embodiment, the resolution of the component area CA may be about ½, ⅜, ⅓, ¼, ⅖, ⅛, ⅑, 1/16, etc. of the resolution of the main display area MDA. For example, the resolution of the main display area may be about 400 ppi or higher, and the resolution of the component area CA may be about 200 ppi or about 100 ppi. However, embodiments of the present inventive concepts are not limited thereto.

Each of pixel circuits driving the main and auxiliary sub-pixels Pm and Pa may be electrically connected to external circuits arranged in the peripheral area DPA. A first scan driving circuit SDRV1, a second scan driving circuit SDRV2, a terminal portion PAD, a driving voltage supply line 11, and a common voltage supply line 13 may be arranged in the peripheral area DPA.

The first scan driving circuit SDRV1 may be configured to apply a scan signal to each of the pixel circuits driving the main and auxiliary sub-pixels Pm and Pa through a scan line SL. The first scan driving circuit SDRV1 may be configured to apply an emission control signal to each of the pixel circuits through an emission control line EL. As shown in the embodiment of FIG. 3, the second scan driving circuit SDRV2 may be located on the opposite side to the first scan driving circuit SDRV1 based on the main display area MDA and may be approximately parallel with the first scan driving circuit SDRV1. One or more of the pixel circuits of the main sub-pixels Pm of the main display area MDA may be electrically connected to the first scan driving circuit SDRV1, and the remaining pixel circuits of the main sub-pixels Pm may be electrically connected to the second scan driving circuit SDRV2. One or more of the pixel circuits of the auxiliary sub-pixels Pa of the component area CA may be electrically connected to the first scan driving circuit SDRV1, and remain pixel circuits of the auxiliary sub-pixels Pa may be electrically connected to the second scan driving circuit SDRV2. However, embodiments of the present inventive concepts are not limited thereto. For example, in an embodiment, the second scan driving circuit SDRV2 may be omitted.

The terminal portion PAD may be disposed at a side of the substrate 100. For example, in the embodiment shown in FIG. 3, the terminal pad pip is disposed on a lower end of the substrate (e.g., in the −y direction). The terminal portion PAD may not be covered by an insulating layer and may be exposed, and may be connected to a display circuit board 30. A display driver 32 may be disposed in the display circuit board 30. The display driver 32 may be configured to generate a control signal to be transmitted to the first scan driving circuit SDRV1 and the second scan driving circuit SDRV2. Also, the display driver 32 may supply a driving voltage ELVDD to the driving voltage supply line 11 and supply a common voltage ELVSS to the common voltage supply line 13. The driving voltage ELVDD may be applied to the pixel circuits of the main and auxiliary sub-pixels Pm and Pa through a driving voltage line PL connected to the driving voltage supply line 11, and the common voltage ELVSS may be connected to the common voltage supply line 13 and applied to an opposite electrode of the display element. The display driver 32 may be configured to generate a data signal, and the generated data signal may be transmitted to the pixel circuits of the main and auxiliary sub-pixels Pm and Pa through a fan-out wire FW and a data line DL connected to the fan-out wire FW.

As shown in the embodiment of FIG. 3, the driving voltage supply line 11 may extend longitudinally in an x direction under the main display area MDA. The common voltage supply line 13 may have a loop shape having an open side and may partially surround the main display area MDA. For example, the open side may be a lower surface of the main display area MDA (e.g., in a −y direction).

Figure 4:
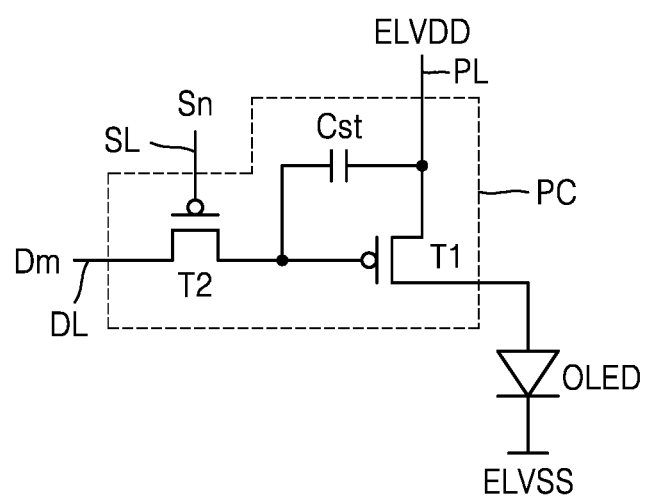
FIGS. 4 and 5 are equivalent circuit diagrams of pixel circuits driving sub-pixels, according to embodiments of the present inventive concepts.
Figure 5:
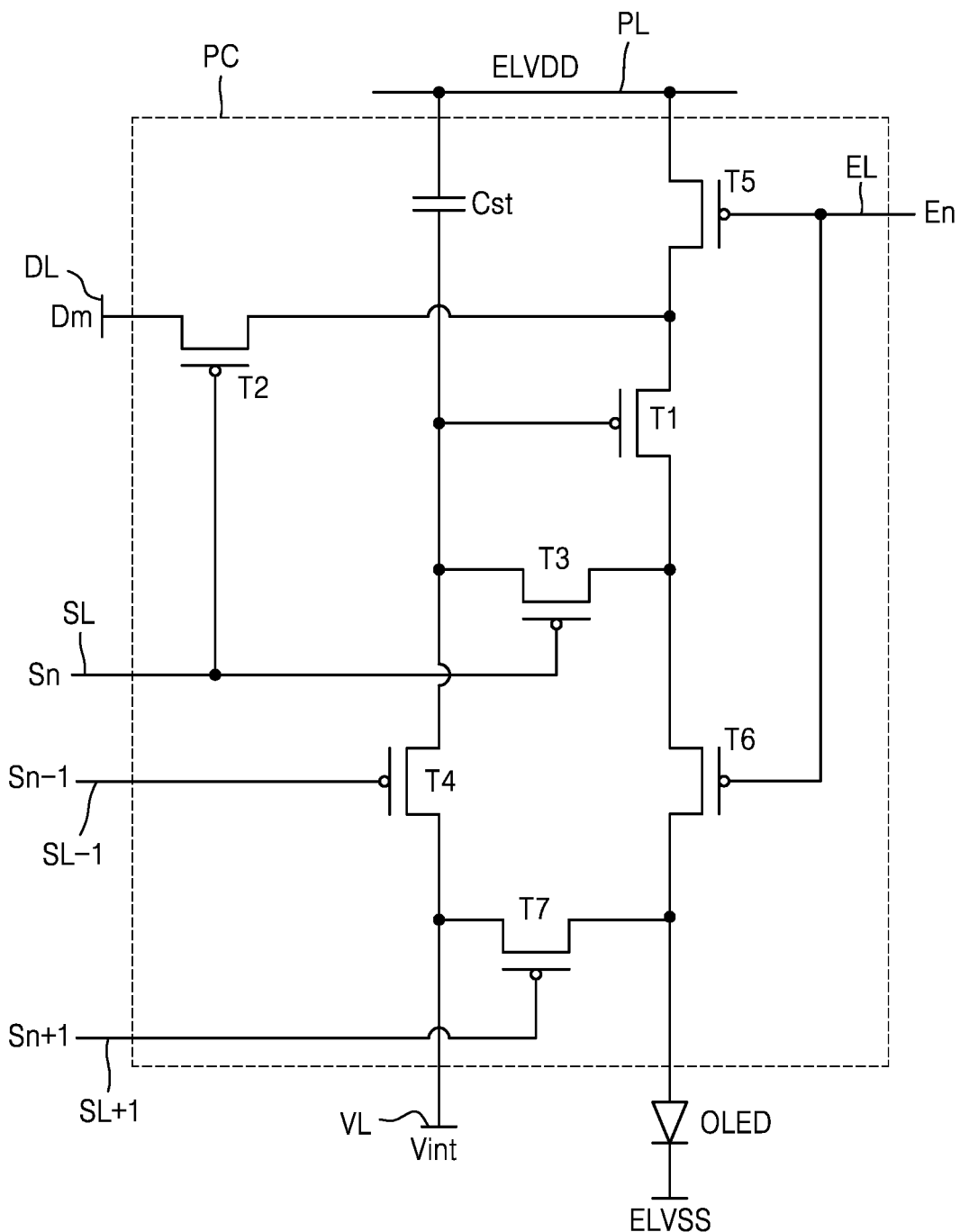

FIGS. 4 and 5 are equivalent circuit diagrams of pixel circuits PC driving sub-pixels, according to embodiments of the present inventive concepts.

Referring to the embodiment of FIG. 4, the pixel circuit PC may be connected to the organic light-emitting diode OLED for emission of light by the sub-pixels. As shown in the embodiment of FIG. 4, the pixel circuit PC may include a driving thin-film transistor T1, a switching thin-film transistor T2, and a storage capacitor Cst. The switching thin-film transistor T2 may be connected to the scan line SL and the data line DL and may be configured to transmit a data signal Dm provided through the data line DL, to the driving thin-film transistor T1, in response to a scan signal Sn provided through the scan line SL.

The storage capacitor Cst may be connected to the switching thin-film transistor T2 and the driving voltage line PL and may be configured to store a voltage corresponding to a difference between a voltage received from the switching thin-film transistor T2 and the driving voltage ELVDD supplied to the driving voltage line PL.

The driving thin-film transistor T1 may be connected to the driving voltage line PL and the storage capacitor Cst. The driving thin-film transistor T1 may also be configured to control a driving current flowing from the driving voltage line PL through the organic light-emitting diode OLED in correspondence with a value of the voltage stored in the storage capacitor Cst. The organic light-emitting diode OLED may emit light having a certain brightness according to the level of the driving current.

It is described with respect to FIG. 4 that the pixel circuit PC includes two thin-film transistors and one storage capacitor. However, embodiments of the present inventive concepts are not limited thereto. Additionally, while the embodiment of FIG. 4 includes a single gate electrode, in other embodiments the driving thin-film transistor T1 and the switching thin-film transistor T2 may include a dual gate electrode, etc.

Referring to the embodiment of FIG. 5, the pixel circuit PC may include the driving thin-film transistor T1, the switching thin-film transistor T2, a compensation thin-film transistor T3, a first initialization thin-film transistor T4, an operation control thin-film transistor T5, an emission control thin-film transistor T6, and a second initialization thin-film transistor T7.

FIG. 5 illustrates an embodiment in which each pixel circuit PC includes signal lines SL, SL−1, SL+1, EL, and DL, an initialization voltage line VL, and the driving voltage line PL. However, embodiments of the present inventive concepts are not limited thereto. For example, in another embodiment, at least one of the signal lines SL, SL−1, SL+1, EL, and DL and/or the initialization voltage line VL may be shared by neighboring pixel circuits.

A drain electrode of the driving thin-film transistor T1 may be electrically connected to the organic light-emitting diode OLED through the emission control thin-film transistor T6. The driving thin-film transistor T1 may be configured to receive a data signal Dm according to a switching operation of the switching thin-film transistor T2 and supply a driving current to the organic light-emitting diode OLED.

A gate electrode of the switching thin-film transistor T2 may be connected to the scan line SL, and a source electrode of the switching thin-film transistor T1 may be connected to the data line DL. A drain electrode of the switching thin-film transistor T2 may be connected to a source electrode of the driving thin-film transistor T1 and may be connected to the driving voltage line PL through the operation control thin-film transistor T5.

The switching thin-film transistor T2 may be turned on in response to a scan signal Sn transmitted through the scan line SL and may be configured to perform a switching operation of transmitting a data signal Dm transmitted through the data line DL to the source electrode of the driving thin-film transistor T1.

A gate electrode of the compensation thin-film transistor T3 may be connected to the scan line SL. A source electrode of the compensation thin-film transistor T3 may be connected to the drain electrode of the driving thin-film transistor T1 and may be connected to a pixel electrode of the organic light-emitting diode OLED through the emission control thin-film transistor T6. A drain electrode of the compensation thin-film transistor T3 may be connected to any one electrode of the storage capacitor Cst, a source electrode of the first initialization thin-film transistor T4, and a gate electrode of the driving thin-film transistor T1. The compensation thin-film transistor T3 may be turned on in response to a scan signal Sn transmitted through the scan line SL and may be configured to connect the gate electrode of the driving thin-film transistor T1 with the drain electrode of the driving thin-film transistor T1 to diode-connect the driving thin-film transistor T1.

A gate electrode of the first initialization thin-film transistor T4 may be connected to a previous scan line SL−1. A drain electrode of the first initialization thin-film transistor T4 may be connected to the initialization voltage line VL. The source electrode of the first initialization thin-film transistor T4 may be connected to any one electrode of the storage capacitor Cst, the drain electrode of the compensation thin-film transistor T3, and the gate electrode of the driving thin-film transistor T1. The first initialization thin-film transistor T4 may be turned on in response to a previous scan signal Sn−1 received through the previous scan line SL−1 and may be configured to perform an initialization operation of initializing a voltage of the gate electrode of the driving thin-film transistor T1 by transmitting an initialization voltage Vint to the gate electrode of the driving thin-film transistor T1.

A gate electrode of the operation control thin-film transistor T5 may be connected to an emission control line EL. A source electrode of the operation control thin-film transistor T5 may be connected to the driving voltage line PL. A drain electrode of the operation control thin-film transistor T5 may be connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to the pixel electrode of the organic light-emitting diode OLED. The operation control thin-film transistor T5 and the emission control thin-film transistor T6 may be simultaneously turned on in response to an emission control signal En received through the emission control line EL so that, a driving voltage ELVDD may be transmitted to the organic light-emitting diode OLED and a driving current may flow in the organic light-emitting diode OLED.

A gate electrode of the second initialization thin-film transistor T7 may be connected to a next scan line SL+1. A source electrode of the second initialization thin-film transistor T7 may be connected to the pixel electrode of the organic light-emitting diode OLED. A drain electrode of the second initialization thin-film transistor T7 may be connected to the initialization voltage line VL. The second initialization thin-film transistor T7 may be turned on in response to a next scan signal Sn+1 received through the next scan line SL+1 and may be configured to initialize the pixel electrode of the organic light-emitting diode OLED.

FIG. 5 illustrates an embodiment in which the first initialization thin-film transistor T4 and the second initialization thin-film transistor T7 are respectively connected to the previous scan line SL−1 and the next scan line SL+1. However, embodiments of the present inventive concepts are not limited thereto. For example, in an embodiment both of the first initialization thin-film transistor T4 and the second initialization thin-film transistor T7 may be connected to the previous scan line SL−1 and driven according to the previous scan signal Sn−1.

The other electrode of the storage capacitor Cst may be connected to the driving voltage line PL. One electrode of the storage capacitor Cst may be connected to the gate electrode of the driving, thin-film transistor T1, the drain electrode of the compensation thin-film transistor T3, and the source electrode of the first thin-film transistor T4.

An opposite electrode (e.g., a cathode) of the organic light-emitting diode OLED may receive the common voltage ELVSS. The organic light-emitting diode OLED may emit light by receiving the driving current from the driving thin-film transistor T1.

The pixel circuits PC are not limited to the pixel circuits PC having the numbers and circuit designs of the thin-film transistors and the storage capacitors described above with reference to the embodiments of FIGS. 4 and 5, and may be variously modified. For example, in some embodiments at least one of the transistors may not include a single gate electrode and may include a dual gate electrode, etc.

The pixel circuits PC driving the main sub-pixel Pm and the auxiliary sub-pixel Pa may be the same as or different from each other. For example, the pixel circuit PC driving the main sub-pixel Pm and the pixel circuit PC driving the auxiliary sub-pixel Pa may correspond to the pixel circuit PC illustrated in the embodiment of FIG. 5. In an embodiment, the pixel circuit PC driving the main sub-pixel Pm may be implemented as the pixel circuit PC illustrated in the embodiment of FIG. 4, and the pixel circuit PC driving the auxiliary sub-pixel Pa may be implemented as the pixel circuit PC illustrated in the embodiment of FIG. 5.

Figure 6:
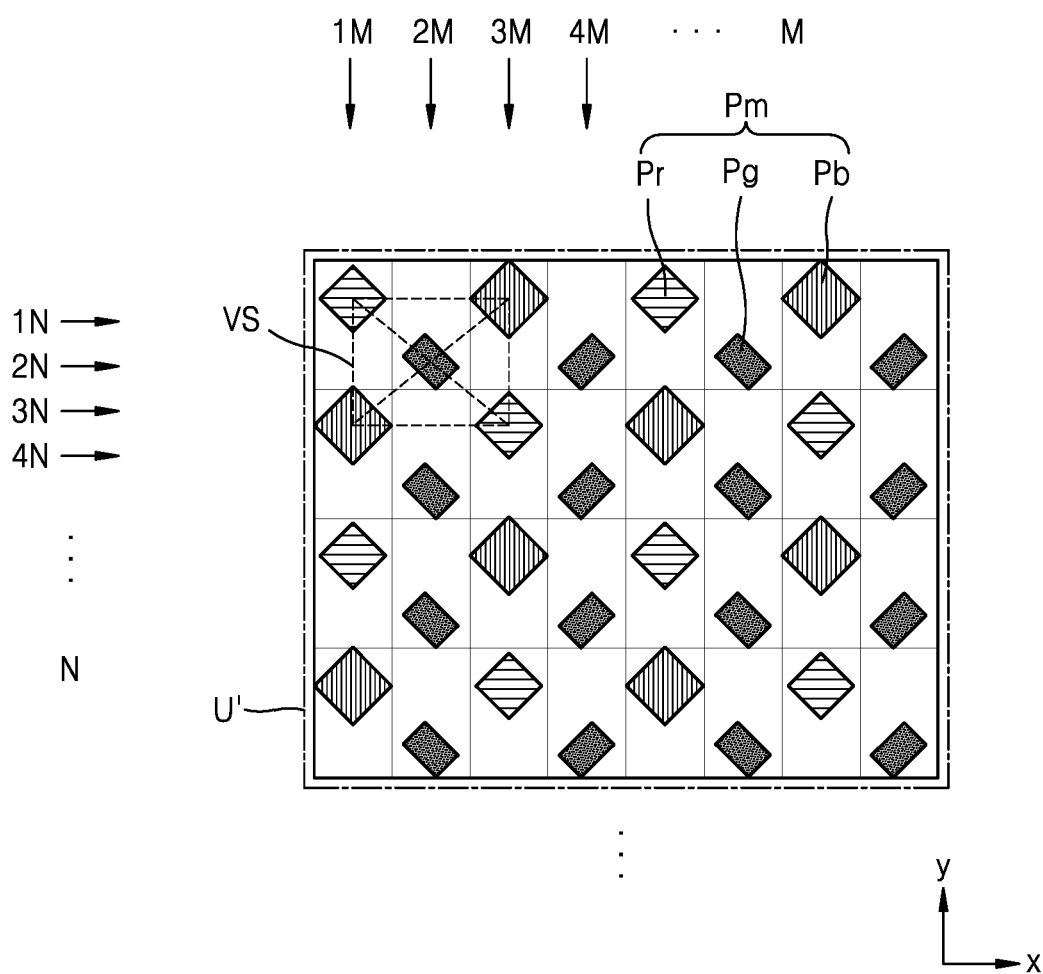
FIG. 6 is a plan view of a pixel arrangement structure in a main display area, according to an embodiment of the present inventive concepts.

FIG. 6 is a schematic plan view of a pixel arrangement structure in the main display area MDA, according to an embodiment of the present inventive concepts.

The plurality of main sub-pixels Pm may be arranged in the main display area MDA. In this specification, a sub-pixel denotes a smallest unit for realizing an image, which corresponds to an emission area. When an organic light-emitting diode is implemented as a display element, the emission area may be defined by an opening of a pixel-defining layer. This aspect will be described below.

As illustrated in the embodiment of FIG. 6, the main sub-pixels Pm arranged in the main display area MDA may be arranged in a pentile structure. The main sub-pixels Pm may include a first sub-pixel Pr, a second sub-pixel Pg, and a third sub-pixel Pb, and the first sub-pixel Pr, the second sub-pixel Pg, and the third sub-pixel Pb may provide red, green, and blue light, respectively.

A plurality of first sub-pixels Pr and a plurality of third sub-pixels Pb may be alternately arranged in a first row 1N (e.g., in the x direction), a plurality of second sub-pixels Pg may be arranged in a second row 2N adjacent to the first row 1N that is spaced apart from the plurality of first sub-pixels Pr and the plurality of third sub-pixels Pb in the first row 1N (e.g., in the y direction), a plurality of third sub-pixels Pb and a plurality of first sub-pixels Pr may be alternately arranged (e.g., in the x direction) in a third row 3N adjacent to the second row 2N (e.g., adjacent in the y direction), and a plurality of second sub-pixels Pg may be arranged in a fourth row 4N adjacent to the third row 3N (e.g., in the y direction) to be spaced apart from the plurality of third sub-pixels Pb and the plurality of first sub-pixels Pr in the third row 3N, wherein these arrangements of the pixels may be repeated through N rows. As shown in the embodiment of FIG. 6, the numbers of the first sub-pixels Pr and the third sub-pixels Pb may be greater than the number of the second sub-pixels Pg.

The plurality of first sub-pixels Pr and the plurality of third sub-pixels Pb arranged in the first row 1N may be arranged to be offset (e.g., in the x direction) from the plurality of second sub-pixels Pg arranged in the second row 2N. Thus, the plurality of first sub-pixels Pr and the plurality of third sub-pixels Pb may be alternately arranged in a first column 1M, the plurality of second sub-pixels Pg may be arranged in a second column 2M adjacent to the first column 1M to be spaced apart from the plurality of first sub-pixels Pr and the plurality of third sub-pixels Pb (e.g., in the x direction), the plurality of third sub-pixels Pb and the plurality of first sub-pixels Pr may be alternately arranged in a third column 3M adjacent to the second column 2M, and the plurality of second sub-pixels Pg may be arranged in a fourth column 4M adjacent to the third column 3M to be spaced apart from the plurality of third sub-pixels Pb and the plurality of first sub-pixels Pr. These arrangements of the pixels may be repeated through M columns.

To describe the pixel arrangement structure in a different way, as shown in FIG. 6, the first sub-pixels Pr may be arranged at a first vertex and a third vertex of a virtual square VS having a center point as a center point of the second sub-pixels Pg, the first and third vertexes facing each other, and the third sub-pixels Pb may be arranged at a second vertex and a fourth vertex, which are the other vertexes of the virtual square VS. In an embodiment, the virtual square VS may be variously modified to include a rectangular shape, a diamond shape, a square shape, etc.

This pixel arrangement structure may be referred to as a pentile matrix structure or a pentile structure. Also, a rendering operation for representing a color by sharing adjacent pixels may be applied in this structure, to achieve a high resolution by using a small number of pixels.

The embodiment of FIG. 6 illustrates that the plurality of main sub-pixels Pm are arranged in the pentile matrix structure. However, embodiments of the present inventive concepts are not limited thereto. For example, the plurality of main sub-pixels Pm may be arranged in various shapes, such as a stripe structure, a mosaic arrangement structure, a delta arrangement structure, etc.

Figure 7:
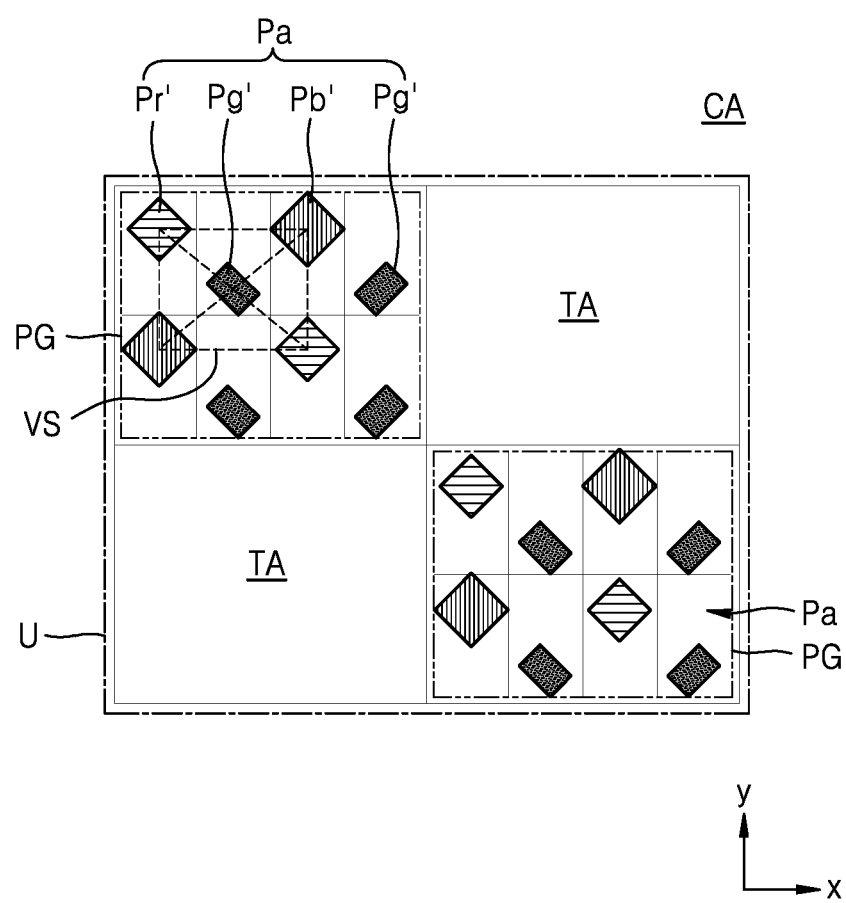
FIGS. 7 and 8 are plan views of a pixel arrangement structure in a component area, according to an embodiment of the present inventive concepts.
Figure 8:
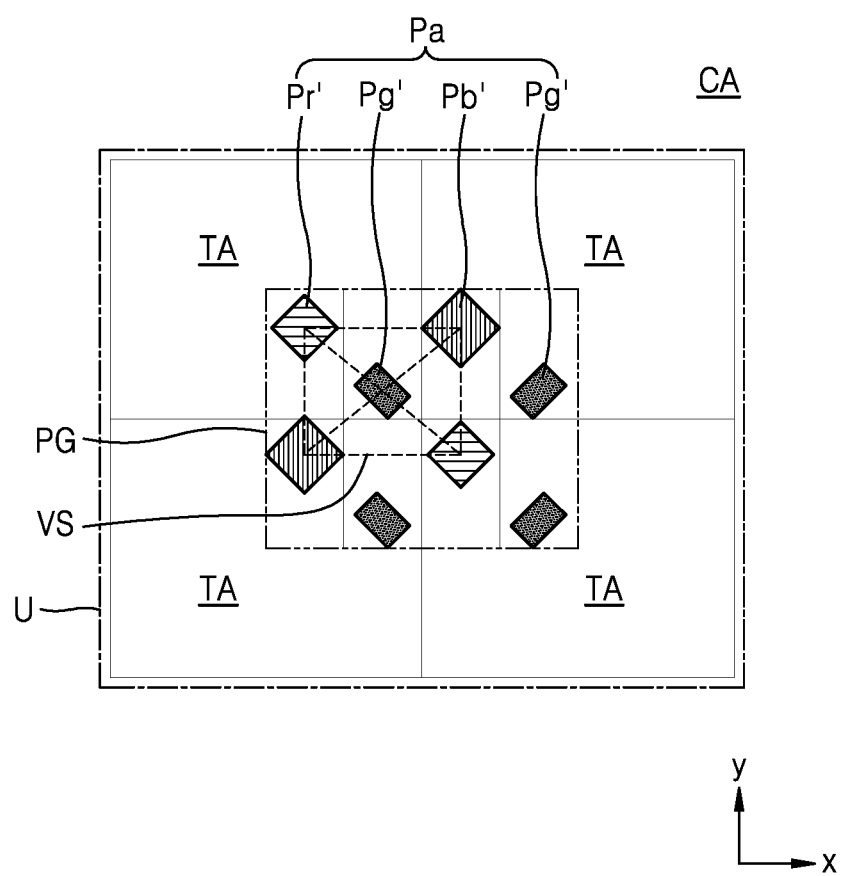

FIGS. 7 and 8 are schematic plan views of a pixel arrangement structure in the component area CA, according to an embodiment of the present inventive concepts.

Referring to the embodiment of FIG. 7, the plurality of auxiliary sub-pixels Pa may be arranged in the component area CA. In an embodiment, each of the plurality of auxiliary sub-pixels Pa may emit any one of red, green, blue, and white light.

As shown in the embodiment of FIG. 7, the component area CA may have a pixel group PG including at least one auxiliary sub-pixel Pa and the transmission area TA. The pixel group PG and the transmission area TA may be alternately arranged in an x direction and a y direction. For example, the pixel group PG and the transmission area TA may be arranged in a grid shape. In this embodiment, the component area CA may have a plurality of pixel groups PG and a plurality of transmission areas TA.

The pixel group PG may be defined as a set of sub-pixels formed by grouping the plurality of auxiliary sub-pixels Pa in a predetermined unit. For example, as illustrated in FIG. 7, one pixel group PG may include eight auxiliary sub-pixels Pa arranged in a pentile structure. For example, one pixel group PG may include two first sub-pixels Pr', four second sub-pixels Pg', and two third sub-pixels Pb'.

In the component area CA, a basic unit U including a certain number of pixel groups PG and a certain number of transmission areas TA may be repeatedly arranged in the x direction and the y direction. In FIG. 7, the basic unit U may include two pixel groups PG and two transmission areas TA adjacent to the pixel groups PG, in a square shape. The basic unit U is obtained by dividing repeated shapes. The basic unit U does not denote that components included in a basic unit U are separate from other components included in another basic unit.

Referring to the embodiment of FIG. 6, a corresponding unit U' having the same area as the basic unit U may be set in the main display area MDA. In this embodiment, the number of main sub-pixels Pm included in the corresponding unit U' may be greater than the number of auxiliary sub-pixels Pa included in the basic unit U. For example, as shown in the embodiment of FIG. 6, the basic unit U may include 16 auxiliary sub-pixels Pa and the corresponding unit U' may include 32 main sub-pixels Pm. Accordingly, the number of auxiliary sub-pixels Pa and the number of main sub-pixels Pm arranged in the same area may have a ratio of 1:2. However, embodiments of the present inventive concepts are not limited thereto.

As illustrated in the embodiment of FIG. 7, when the auxiliary sub-pixels Pa are arranged in the pentile structure and the resolution of the auxiliary sub-pixels Pa corresponds to ½ of the resolution of the main sub-pixels arranged in the main display area MDA, the pixel arrangement structure may be referred to as a ½ pentile structure. The number and the arrangement structure of auxiliary sub-pixels Pa included in the pixel group PG may be designed to vary according to the resolution of the component area CA.

Referring to the embodiment of FIG. 8, the pixel arrangement structure of the component area CA may correspond to a ¼ pentile structure. According to the present embodiment, while 8 auxiliary sub-pixels Pa of the pixel group PG may be arranged in the pentile structure, the basic unit U may include only one pixel group PG. The other areas of the basic unit U may be occupied by the transmission area TA. Thus, the number of auxiliary sub-pixels Pa and the number of main sub-pixels Pm arranged per the same area may have a ratio of 1:4. In this embodiment, one pixel group PG may be surrounded by the transmission area TA. For example, as shown in the embodiment of FIG. 8, one pixel group PG may be completely surrounded by the transmission area TA (e.g., in the x and y directions).

The embodiments of FIGS. 7 and 8 illustrate that the plurality of auxiliary sub-pixels Pa are arranged in the pentile matrix structure. However, embodiments of the present inventive concepts are not limited thereto. For example, the plurality of auxiliary sub-pixels Pa may be arranged in various different shapes, such as a stripe structure, a mosaic arrangement structure, a delta arrangement structure, etc.

The embodiments of FIGS. 7 and 6 also illustrate that sizes of the auxiliary sub-pixels Pa are the same as sizes of the main sub-pixels Pm of the embodiment of FIG. 6. However, embodiments of the present inventive concepts are not limited thereto. For example, the sizes of the auxiliary sub-pixels Pa may be greater than the sizes of the main sub-pixels Pm with respect to the same color. For example, the sizes of third sub-pixels Pb' of the auxiliary sub-pixels Pa may be greater than the sizes of third sub-pixels Pb of the main sub-pixels Pm. In an embodiment, the difference in the sizes may be designed by taking into account a difference of brightness levels and/or resolutions between the component area CA and the main display area MDA.

Figure 9:
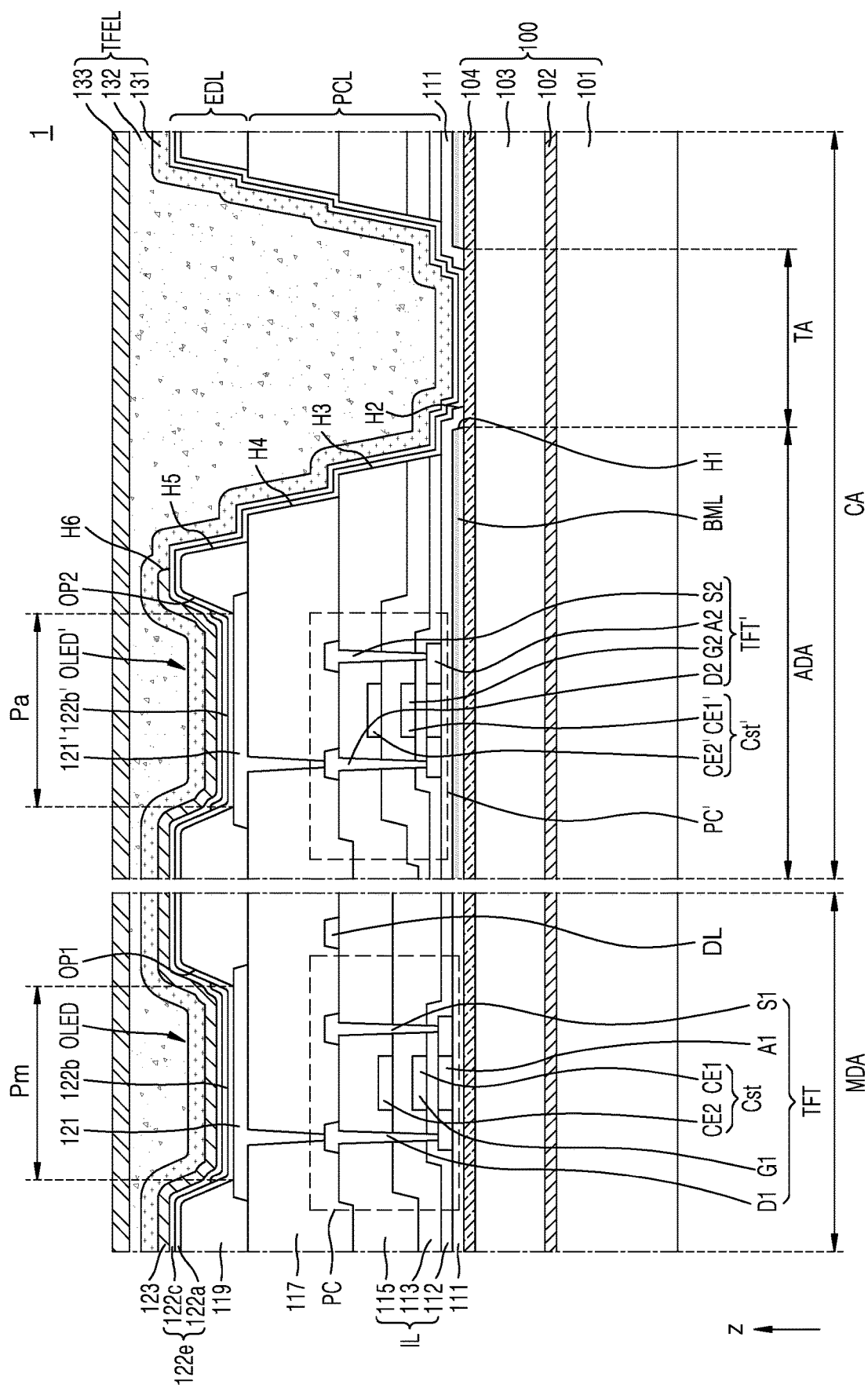
FIG. 9 is a cross-sectional view of a portion of a display apparatus according to an embodiment of the present inventive concepts, the portion corresponding to a main display area and a component area.

FIG. 9 is a schematic cross-sectional view of a portion of the display apparatus 1 according to an embodiment of the present inventive concepts. The portion includes the main display area MDA and the component area CA.

Referring to the embodiment of FIG. 9, the display apparatus 1 may include the main display area MDA and the component area CA. The main sub-pixels Pm may be arranged in the main display area MDA, and the component area CA may include the auxiliary display area ADA in which the auxiliary sub-pixels Pa are arranged and the transmission area TA which does not include auxiliary sub-pixels Pa. While FIG. 9 illustrates only a single main sub-pixel Pm and a single auxiliary sub-pixel Pa for convenience of illustration, a plurality of main sub-pixels Pm and a plurality of auxiliary sub-pixels Pa may be arranged in the main display area MDA and the auxiliary display area ADA, respectively. A main pixel circuit PC including the main thin-film transistor TFT, the main storage capacitor Cst, and the main organic light-emitting diode OLED, which is a main display element connected to the main pixel circuit PC, may be disposed in the main display area MDA. An auxiliary pixel circuit PC' including the auxiliary thin-film transistor TFT', the auxiliary storage capacitor Cst', and the auxiliary organic light-emitting diode OLED', which is an auxiliary display element connected to the auxiliary pixel circuit PC', may be disposed in the component area CA.

While the embodiment of FIG. 9 shows the main and auxiliary organic light-emitting diodes OLED and OLED' as the display elements, embodiments of the present inventive concepts are not limited thereto. For example, in another embodiment, the main and auxiliary display elements may include an inorganic light-emitting device, a quantum dot light-emitting device, etc.

Hereinafter, a structure corresponding to a stack of the components included in the display apparatus 1 is described. The display apparatus 1 may include a stack of the substrate 100, a buffer layer 111, the circuit layer PCL, the display element layer EDL, and an encapsulation member such as the thin-film encapsulation layer TFEL arranged in the z direction.

As described above, the substrate 100 may include an insulating material, such as glass, quartz, and polymer resins. The substrate 100 may include a rigid substrate or a flexible substrate, which may be bent, folded, or rolled.

As shown in the embodiment of FIG. 9, the substrate 100 may include a first layer 101, a first barrier layer 102, a second layer 103, and a second barrier layer 104 that are sequentially stacked (e.g., in the z direction).

In an embodiment, the first layer 101 and the second layer 103 may include polymer resins having high heat resistance. For example, the first layer 101 and the second layer 103 may include at least one material selected from the group consisting of polyether sulfone, polyacrylate, polyether imide, polyethylene naphthalate, polyethylene terephthalate, polyphenylene sulfide, polyarylate, polyimide, polycarbonate, cellulose tri-acetate, cellulose acetate propionate, and polyarylene ethersulfone. For example, the first layer 101 and the second layer 103 may include polyimide. The first barrier layer 102 and the second barrier layer 104 may prevent penetration of external air.

The buffer layer 111 may be disposed on the substrate 100. For example, as shown in the embodiment of FIG. 9, a lower surface of the buffer layer 111 may directly contact an upper surface of the substrate 100, such as an upper surface of the second barrier layer 104. The buffer layer 111 may reduce or prevent penetration of foreign materials, moisture, or external air from below the substrate 100, and may planarize the substrate 100. In an embodiment, the buffer layer 111 may include an inorganic material, such as oxide or nitride, an organic material, or an organic and inorganic compound, and may have a single-layered structure or a multi-layered structure including an inorganic material and/or an organic material. In some embodiments, the buffer layer 111 may include silicon oxide ($SiO_x$) or silicon nitride ($SiN_x$). In some embodiments, the buffer layer 111 may include a stack of $SiO_x$ or $SiN_x$. However, embodiments of the present inventive concepts are not limited thereto.

In the component area CA, the bottom metal layer BML may be arranged between the substrate 100 and the buffer layer III (e.g., in the z direction). The bottom metal layer BML may be disposed below the auxiliary pixel circuit PC' and may prevent the characteristics of the auxiliary thin-film transistor TFT' from being degraded due to the light emitted from a component, etc. Also, the bottom metal layer BML may prevent the light emitted from the component or traveling towards the component from being diffracted through a small gap between wires connected to the auxiliary pixel circuit PC'. The bottom metal layer BML may not be disposed in the transmission area TA.

A bias voltage may be applied to the bottom metal layer BML. The bottom metall layer BML may reduce the probability of the occurrence of electrostatic discharge by receiving the bias voltage. In an embodiment, the bottom metal layer BML may include at least one compound selected from Al, Pt, Pd, Ag, Mg, Au, Ni, Nd, Ir, Cr, Ca, Mo, Ti, W. and Cu. The bottom metal layer BML may include a single layer or multiple layers including the materials described above.

In an embodiment, the bottom metal layer BML may be disposed in the entirety of the component area CA. In this embodiment, the bottom metal layer BML may include a first hole H1 overlapping the transmission area TA. For example, the first hole H1 may be disposed in the entire portion of the transmission area TA. A shape and a size of the transmission area TA may be defined by a shape and a size of the first hole H1.

The buffer layer 111 may have a second hole H2 that extends within the transmission area TA. The second hole H2 may expose at least a portion of an upper surface of the substrate 100 (e.g., the second barrier layer 104). As shown in the embodiment of FIG. 9, an area of the second hole H2 may be less than an area of the first hole H1 defined in the bottom metal layer BML.

The main thin-film transistor TFT and the auxiliary thin-film transistor TFT' may be disposed above the buffer layer 111. As shown in the embodiment of FIG. 9, the main thin-film transistor TFT may include a first semiconductor layer A1, a first gate electrode G1, a first source electrode S1, and a first drain electrode D1, and the auxiliary thin-film transistor TFT' may include a second semiconductor layer A2, a second gate electrode G2, a second source electrode S2, and a second drain electrode D2. The main thin-film transistor TFT may be connected to the main organic light-emitting diode OLED and may be configured to drive the main organic light-emitting diode OLED. The auxiliary thin-film transistor TFT' may be connected to the auxiliary organic light-emitting diode OLED' and may be configured to drive the auxiliary organic light-emitting diode OLED'.

For example, the first semiconductor layer A1 and the second semiconductor layer A2 may be arranged above the buffer layer 11 and may include polysilicon. In another embodiment, the first semiconductor layer A1 and the second semiconductor layer A2 may include amorphous silicon. For example, the first semiconductor layer A1 and the second semiconductor layer A2 may include oxide of at least one material selected from the group, consisting of In, Ga, Sn, Zr, V, Hf, Cd, Ge, Cr, Ti, and Zn. The first semiconductor layer A1 and the second semiconductor layer A2 may include a channel area, and a source area and a drain area doped with impurities.

The semiconductor layer A2 may overlap the bottom metal layer BML with the buffer layer 11 therebetween (e.g., in the z direction). For example, a width of the second semiconductor layer A2 may be less than a width of the bottom metal layer BML, and thus, when viewed from a direction perpendicular to the substrate 100, the second semiconductor layer A2 may entirely overlap the bottom metal layer BML (e.g., in the z direction).

A first insulating layer 112 may be arranged to cover the first semiconductor layer A1 and the second semiconductor layer A2. In an embodiment, the first insulating layer 112 may include an inorganic insulating material, such as at least one compound selected from $SiO_x$, $SiN_x$, $SiO_xN_y$, $Al_2O_3$, $TiO_2$, $Ta_2O_5$, $HfO_2$, and $ZnO_2$. The first insulating layer 112 may include a single layer or multiple layers including the inorganic insulating material described above.

The first gate electrode G1 and the second gate electrode G2 may be arranged above the first insulating layer 112 to overlap the first semiconductor layer A1 and the second semiconductor layer A2, respectively. The first gate electrode G1 and the second gate electrode G2 may include Mo, Al, Cu, Ti, etc., and may include a single layer or multiple layers. For example, the first gate electrode G1 and the second gate electrode G2 may include a single layer including Mo.

A second insulating layer 113 may be arranged to cover the first gate electrode G1 and the second gate electrode G2. The second insulating layer 113 may include an inorganic insulating material, such as at least one compound selected from $SiO_x$, $SiN_x$, $SiO_xN_y$, $Al_2O_3$, $TiO_2$, $Ta_2O_5$, $HfO_2$, and $ZnO_2$. The second insulating layer 113 may include a single layer or multiple layers including the inorganic insulating material described above.

A first upper electrode CE2 of the main storage capacitor Cst and a second upper electrode CE2' of the auxiliary storage capacitor Cst' may be arranged above the second insulating layer 113. For example as show in the embodiment of FIG. 9, a lower surface of the first upper electrode CE2 and the second upper electrode CE2' may directly contact an upper surface of the second insulating layer 113.

The first upper electrode CE2 may overlap (e.g., in the z direction) the first gate electrode G1 therebelow in the main display area MDA. The first gate electrode G1 and the first upper electrode CE2 overlapping each other with the second insulating layer 113 therebetween may be included in the main storage capacitor Cst. For example, the first gate electrode G1 may correspond to a first lower electrode CE1 of the main storage capacitor Cst. In another embodiment, the first lower electrode CE1 of the main storage capacitor Cst may correspond to a separate component from the first gate electrode G1 of the main thin-film transistor TFT.

The second upper electrode CE2' may overlap (e.g., in the z direction) the second gate electrode G2 therebelow in the component area CA. The second gate electrode G2 and the second upper electrode CE2' overlapping each other with the second insulating layer 113 therebetween may be included in the auxiliary storage capacitor Cst'. For example, the second gate electrode G2 may correspond to a second lower electrode CE1' of the auxiliary storage capacitor Cst'. In another embodiment, the second lower electrode CE1' of the auxiliary storage capacitor Cst' may correspond to a separate component from the second gate electrode G2 of the auxiliary thin-film transistor TFT'.

In an embodiment, the first upper electrode CE2 and the second upper electrode CE2' may include at least one compound selected from Al, Pt, Pd, Ag, Mg, Au, Ni, Nd, Ir, Cr, Ca, Mo, Ti, W, and Cu and may include a single layer or multiple layers including the materials described above.

A third insulating layer 115 may be disposed to cover the first upper electrode CE2 and the second upper electrode CE2'. For example, as shown in the embodiment of FIG. 9, a lower surface of the third insulating layer 115 may directly contact an upper surface of the first upper electrode CE2 and the second upper electrode CE2'. In an embodiment, the third insulating layer 115 may include an inorganic insulating material, such as at least one compound selected from $SiO_x$, $SiN_x$, $SiO_xN_y$, $Al_2O_3$, $TiO_2$, $Ta_2O_5$, $HfO_2$, and $ZnO_2$.

The first insulating layer 112, the second insulating layer 113, and the third insulating layer 115 may be commonly referred to as the inorganic insulating layer IL. The inorganic insulating layer IL may have a third hole H3 corresponding to the transmission area TA. The third hole H3 may expose the buffer layer 111 or a portion of an upper surface of the substrate 100. The third hole H3 may be formed by openings of the first through third insulating layers 112, 113, and 115 overlapping one another, wherein the openings of the first through third insulating layers 112, 113, and 115 extend within the transmission area TA. As shown in the embodiment of FIG. 9, the third hole H3 may also extend within a partial portion of the auxiliary display area ADA adjacent to the transmission area TA. In an embodiment, the openings may be separately formed in separate operations or simultaneously formed in the same operation. When the openings are formed in the separate operations, an inner surface of the third hole H3 may not be smooth and may have a step difference by having a stair shape.

An area of the third hole H3 defined by the inorganic insulating layer IL may be greater than areas of the first hole H1 defined in the bottom metal layer BML and the second hole H2 defined in the buffer layer 111. Since the buffer layer 111 and the inorganic insulating layer IL include the first and second holes H1 and H2 disposed within the transmission area TA, the light transmittance of the component area CA may be increased.

However, in an embodiment, the inorganic insulating layer IL may include a groove, rather than the third hole H3 exposing the buffer layer 111 and/or the substrate 100. In another embodiment, the inorganic insulating layer IL may not have the third hole H3 or the groove corresponding to the transmission area TA. The inorganic insulating layer IL may include an inorganic insulating material generally having high light transmittance, and thus, even when there is no hole or groove corresponding to the transmission area TA, sufficient transmittance may be obtained for the component 40 to transmit/receive a sufficient amount of light.

As shown in the embodiment of FIG. 9, the data line DL, the first and second source electrodes S1 and S2 and the first and second drain electrodes D1 and D2 may be disposed on the third insulating layer 115. For example, lower surfaces of the data line DL, the first and second source electrodes S1 and S2 and the first and second drain electrodes D1 and D2 may directly contact an upper surface of the third insulating layer 115. In an embodiment, the data line DL, the first and second source electrodes S1 and S2, and the first and second drain electrodes D1 and D2 may include a conductive material including at least one compound selected from Mo, Al, Cu, Ti, etc. and may include multiple layers or a single layer including the materials described above. For example, in an embodiment, the data line DL, the first and second source electrodes S1 and S2, and the first and second drain electrodes D1 and D2 may include a multi-layered structure including Ti/Al/Ti.

A planarization layer 117 may be disposed to cover the data line DL, the first and second source electrodes S1 and S2, and the first and second drain electrodes D1 and D2. The planarization layer 117 may have a planarized upper surface so that a first pixel electrode 121 and a second pixel electrode 121' may be formed thereon to be substantially flat.

The planarization layer 117 may include an organic material or an inorganic material and may have a single-layered structure or a multi-layered structure. In an embodiment, the planarization layer 117 may include benzocyclobutene (BCB), PI, hexamethyldisiloxane (HMDSO), polymethylmethacrylate (PMMA), or a general-purpose polymer, such as polystyrene (PS), a polymer derivate having a phenol-based group, an acryl-based polymer, an imide-based polymer, an aryl ether-based polymer, an amide-based polymer, a fluorine-based polymer, a p-xylene-based polymer, or a vinyl alcohol-based polymer. In an embodiment, the planarization layer 117 may include an inorganic insulating material, such as at least one compound selected from $SiO_x$, $SiN_x$, $SiO_xN_y$, $Al_2O_3$, $TiO_2$, $Ta_2O_5$, $HfO_2$, and $ZnO_2$. When forming the planarization layer 117, chemical mechanical polishing may be performed on an upper surface of a layer that is formed to provide a flat upper surface.

The planarization layer 117 may have a fourth hole H4 that extends within the transmission area TA. As shown in the embodiment of FIG. 9, the fourth hole H4 may also extend within a partial portion of the auxiliary display area ADA adjacent to the transmission area TA. The fourth hole H4 may overlap the third hole H3 defined in the inorganic insulating layer IL. FIG. 9 illustrates that the fourth hole H4 is greater than the third hole H3. However, embodiments of the present inventive concepts are not limited thereto. For example, in an embodiment, the planarization layer 117 may be disposed to cover an edge of the third hole H3 of the inorganic insulating layer IL. Accordingly, an area of the fourth hole H4 may be less than an area of the third hole H3.

The planarization layer 117 may have a via-hole exposing any one of the first source electrode S1 and the first drain electrode D1 of the main thin-film transistor TFT, and the first pixel electrode 121 may contact the first source electrode S1 or the first drain electrode D1 through the via-hole and may be electrically connected to the main thin-film transistor TFT. Also, the planarization layer 117 may have a via-hole exposing any one of the second source electrode S2 and the second drain electrode D2 of the auxiliary thin-film transistor TFT', and the second pixel electrode 121' may contact the second source electrode S2 or the second drain electrode D2 through the via-hole and may be electrically connected to the auxiliary thin-film transistor TFT'.

In an embodiment, the planarization layer 117 may include a first planarization layer and a second planarization layer. When the planarization layer 117 includes the first planarization layer and the second planarization layer, a relatively high integration may be achieved.

In an embodiment, the first pixel electrode 121 and the second pixel electrode 121' may include conductive oxide, such as at least one compound selected from indium tin oxide (ITO), indium zinc oxide (IZO), zinc oxide (ZnO) indium oxide ($In_2O_3$), indium gallium oxide (IGO), and aluminum zinc oxide (AZO). The first pixel electrode 121 and the second pixel electrode 121' may include a reflective layer including Ag, Mg, Al, Pt, Pd, Au, Ni, Nd, Ir, Cr, or a compound thereof. For example, in an embodiment the first pixel electrode 121 and the second pixel electrode 121' may have a structure in which layers including ITO, IZO, ZnO, or $In_2O_3$ are arranged above/below the reflective layer described above. In this embodiment, the first pixel electrode 121 and the second pixel electrode 121' may have a structure in which an ITO layer, an Ag layer, and an ITO layer are sequentially stacked (e.g., in the z direction).

A pixel-defining layer 119 may include a first opening OP1 and a second opening OP2 covering lateral edges of the first pixel electrode 121 and the second pixel electrode 121' above the planarization layer 117, respectively, and exposing at least portions of the first pixel electrode 121 and the second pixel electrode 121'. For example, as shown in the embodiment of FIG. 9, the pixel-defining layer 119 may expose a central portion of the first pixel electrode 121 and the second pixel electrode 121'. Based on the first opening OP1 and the second opening OP2, emission areas of the main and auxiliary organic light-emitting diodes OLED and OLED', such as sizes and shapes of the main and auxiliary sub-pixels Pm and Pa may be defined.

The pixel-defining layer 119 may increase a distance between lateral edges of the first and second pixel electrodes 121 and 121' and an opposite electrode 123 on the first and second pixel electrodes 121 and 121' to prevent arcs, etc. from occurring at the lateral edges of the first and second pixel electrodes 121 and 121'. In an embodiment, the pixel-defining layer 119 may be formed by using a spin coating method, etc., by using an organic insulating material, such as polyimide, polyamide, acryl resins, BCR, HMDSO, phenol resins, etc. In addition, in an embodiment, a spacer may further be included on the pixel-defining layer 119.

The pixel-defining layer 119 may have a fifth hole H5 that extends within the transmission area TA. The fifth hole H5 may overlap (e.g., in the z direction) the second through fourth holes H2 through H4. For example, as shown in the embodiment of FIG. 9, the fifth hole H5 may extend within a partial portion of the auxiliary display area ADA adjacent to the transmission area TA. The light transmittance of the transmission area TA may be increased via the second through fifth holes H2 through H5 that extend within the transmission area TA. A portion of the opposite electrode 123 to be described below may be arranged at inner surfaces of the second through fifth holes H2 through H5.

A first emission layer 122b and a second emission layer 122b' may be arranged in the first opening OP1 and the second opening OP2 of the pixel-defining layer 119 to respectively overlap the exposed portions of the first pixel electrode 121 and the second pixel electrode 121'. In an embodiment, the first emission layer 122b and the second emission layer 122b' may include a high molecular-weight organic material or a low molecular-weight organic material and may emit red, green, blue, or white light. However, embodiments of the present inventive concepts are not limited thereto.

An organic functional layer 122e may be disposed above and/or below the first emission layer 122b and the second emission layer 122b'. As shown in the embodiment of FIG. 9, the organic functional layer 122e may include a first functional layer 122a and/or a second functional layer 122c. However, embodiments of the present inventive concepts are not limited thereto and the first functional layer 122a or the second functional layer 122c may be omitted in some embodiments.

In an embodiment, the first functional layer 122a may be disposed below the first emission layer 122b and the second emission layer 122b'. The first functional layer 122a may include a single layer or multiple layers including an organic material. The first functional layer 122a may include a hole transport layer (HTL) having a single-layered structure. In another embodiment, the first functional layer 122a may include a hole injection layer (HIL) and an HTL. The first functional layer 122a may integrally correspond to the main and auxiliary organic light-emitting diodes OLED and OLED' included in the main display area MDA and the auxiliary display area ADA of the component area CA.

As shown in the embodiment of FIG. 9, the second functional layer 122c may be disposed above the first emission layer 122b and the second emission layer 122b'. The second functional layer 122c may include a single layer or multiple layers including an organic material. In an embodiment, the second functional layer 122c may include an electron transport layer (ETL) and/or an electron injection layer (EIL). The second functional layer 122c may integrally correspond to the main and auxiliary organic light-emitting diodes OLED and OLED' included in the main display area MDA and the component area CA.

The opposite electrode 123 may be disposed above the second functional layer 122c. The opposite electrode 123 may include a conductive material having a low work function. For example, the opposite electrode 123 may include a (semi) transparent layer including Ag, Mg, Al, Pt, Pd, Ni, Nd, Ir, Cr, Li, Ca, or an alloy thereof. In another embodiment, the opposite electrode 123 may further include a layer, such as ITO, IZO, ZnO, or $In_2O_3$, on the (semi) transparent layer including the materials described above. The opposite electrode 123 may integrally correspond to the main and auxiliary organic light-emitting diodes OLED and OLED' included in the main display area MDA and the component area CA.

Layers formed between the first pixel electrode 121 and the opposite electrode 123 in the main display area MDA may be included in the main organic light-emitting diode OLED. Layers formed between the second pixel electrode 121' and the opposite electrode 123 in the auxiliary display area DA of the component area CA may be included in the auxiliary organic light-emitting diode OLED.

In an embodiment, a capping layer including an organic material may be formed on the opposite electrode 123. The capping layer may be provided to protect the opposite electrode 123 and increase the light extraction efficiency thereof. In an embodiment, the capping layer may include an organic material or an inorganic material having a higher reflectivity than an organic material or an inorganic material included in the opposite electrode 123.

The opposite electrode 123 may have a sixth hole H6 that extends within the transmission area TA. FIG. 9 illustrates that an area of the sixth hole H6 defined in the opposite electrode 123 is greater than an area of the third hole H3 defined in the inorganic insulating layer IL. For example, the sixth hole H6 may extend within a partial portion of the auxiliary display area ADA adjacent to the transmission area TA. However, embodiments of the present inventive concepts are not limited thereto. For example, in an embodiment, the area of the sixth hole H6 may be less than or equal to the area of the third hole H3.

Through the sixth hole H6, a portion of the opposite electrode 123 may not be disposed in the transmission area TA, and thus, the light transmittance of the transmission area TA may be increased. The opposite electrode 123 having the sixth hole H6 may be formed by using various methods. For example, a material for forming the opposite electrode 123 may be disposed on the entire surface of the substrate 100, and then, a material of the partial portion of the opposite electrode 123 disposed in the transmission area TA may be removed via a laser lift off operation so that the opposite electrode 123 in which the sixth hole H6 is defined may be formed. In another embodiment, the opposite electrode 123 having the sixth hole H6 may be formed via a metal self-patterning (MSP) method. In another embodiment, the opposite electrode 123 having the sixth hole H6 may be formed via a method of depositing the opposite electrode 123 using a fine metal mask (FMM).

The thin-film encapsulation layer TFEL may be arranged as an encapsulation member above the display element layer EDL of the display apparatus 1. For example, the main and auxiliary organic light-emitting diodes OLED and OLED' may be encapsulated by the thin-film encapsulation layer TFEL. The thin-film encapsulation layer TFEL may be disposed on the opposite electrode 123. For example, as shown in the embodiment of FIG. 9, a lower surface of the thin-film encapsulation layer TFEL may directly contact an upper surface of the opposite electrode 123. The thin-film encapsulation layer TFEL may prevent the penetration of external moisture or foreign materials into the main and auxiliary organic light-emitting diodes OLED and OLED'.

The thin-film encapsulation layer TFEL may include at least one inorganic layer and at least one organic layer. For example, the embodiment of FIG. 9 illustrates that the thin-film encapsulation layer TFEL has the structure in which the first inorganic layer 131, the organic layer 132, and the second inorganic layer 133 are stacked (e.g., in the z direction). However, embodiments of the present inventive concepts are not limited thereto and the numbers of the organic layers and inorganic layers, and an order in which the organic layers and the inorganic layers are stacked may vary.

In an embodiment, the first inorganic layer 131 and the second inorganic layer 133 may include one or more inorganic insulating materials selected from among $SiO_X$, $SiN_X$, $SiO_XN_Y$, $Al_2O_3$, $TiO_2$, $Ta_2O_5$, $HfO_2$, and $ZnO_2$, and may be formed by using chemical vapor deposition (CVD). The organic layer 132 may include a polymer-based material. The polymer-based material may include silicon-based resins, acryl-based resins, epoxy-based resins, polyimide, and polyethylene.

The first inorganic layer 131, the organic layer 32, and the second inorganic layer 133 may be integrally formed to cover the main display area MDA and the component area CA. For example, as shown in the embodiment of FIG. 9, the first inorganic layer 131, the organic layer 132, and the second inorganic layer 133 may be integrally formed to cover both the auxiliary display area ADA and the transmission area TA in the component area CA. Accordingly, the first inorganic layer 131 and the organic layer 132 may be disposed in the third hole H3 defined in the inorganic insulating layer IL.

Figure 10:
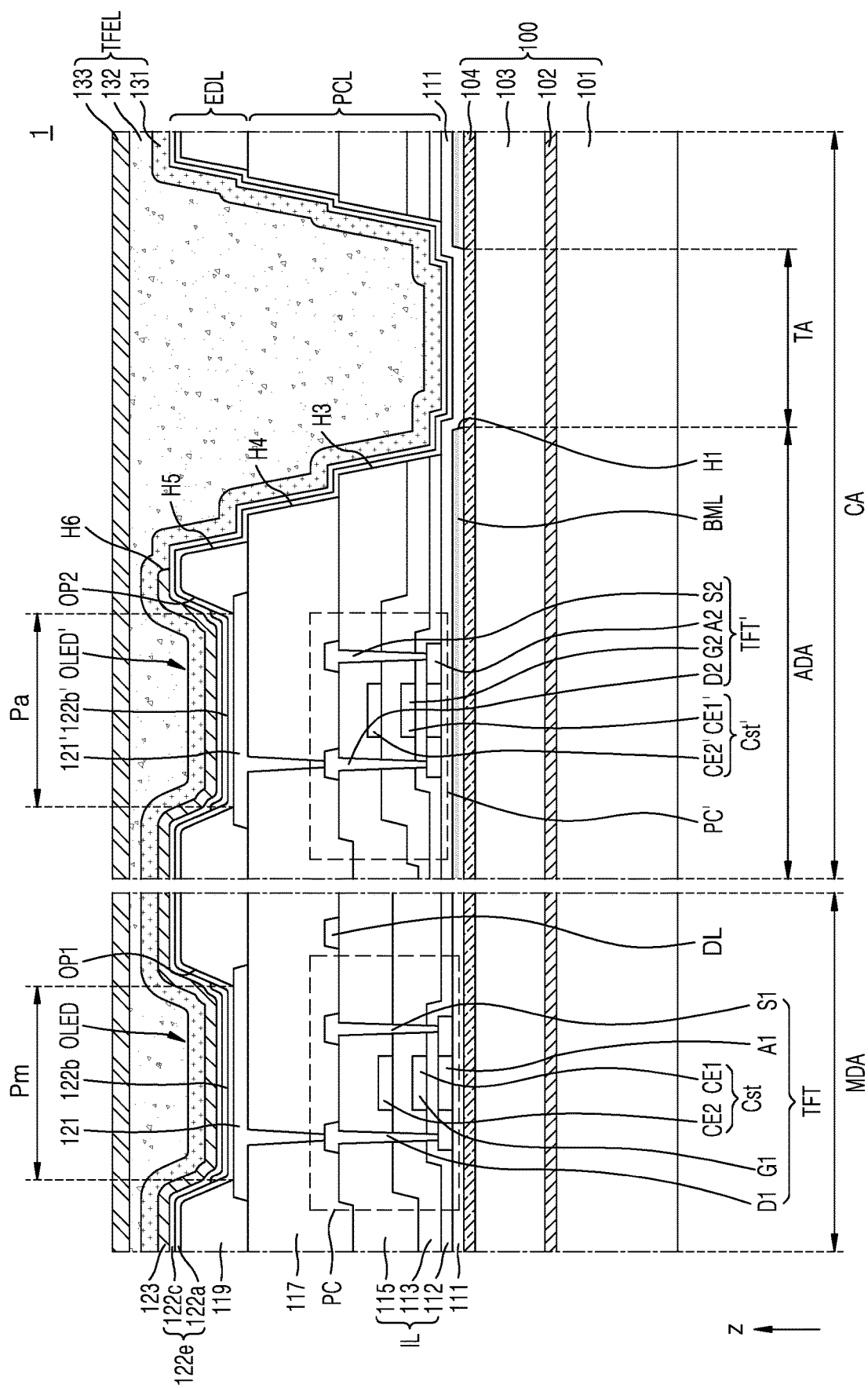
FIGS. 10 through 12 are cross-sectional views of a portion of a display apparatus according to embodiments of the present inventive concepts.
Figure 11:
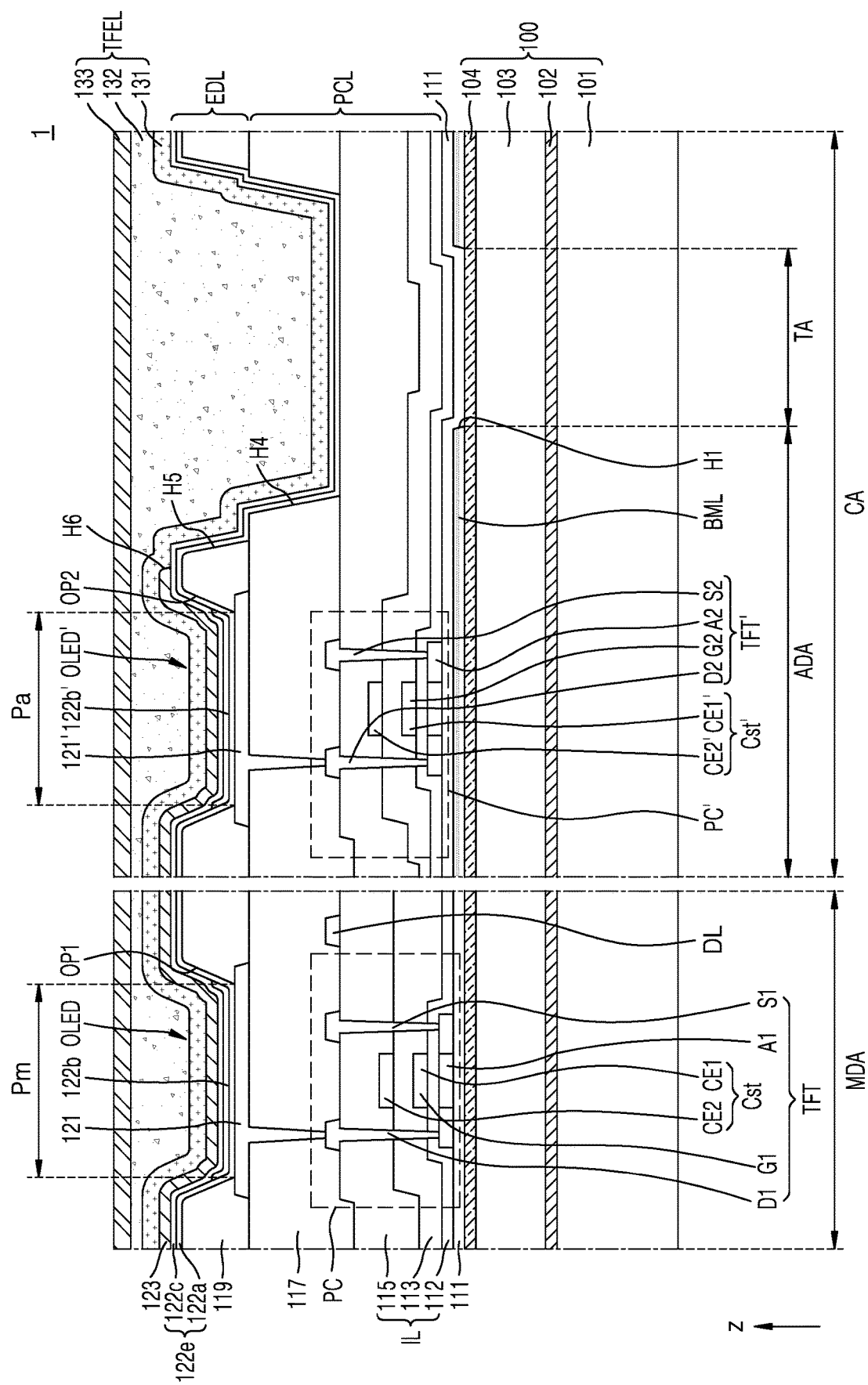
Figure 12:
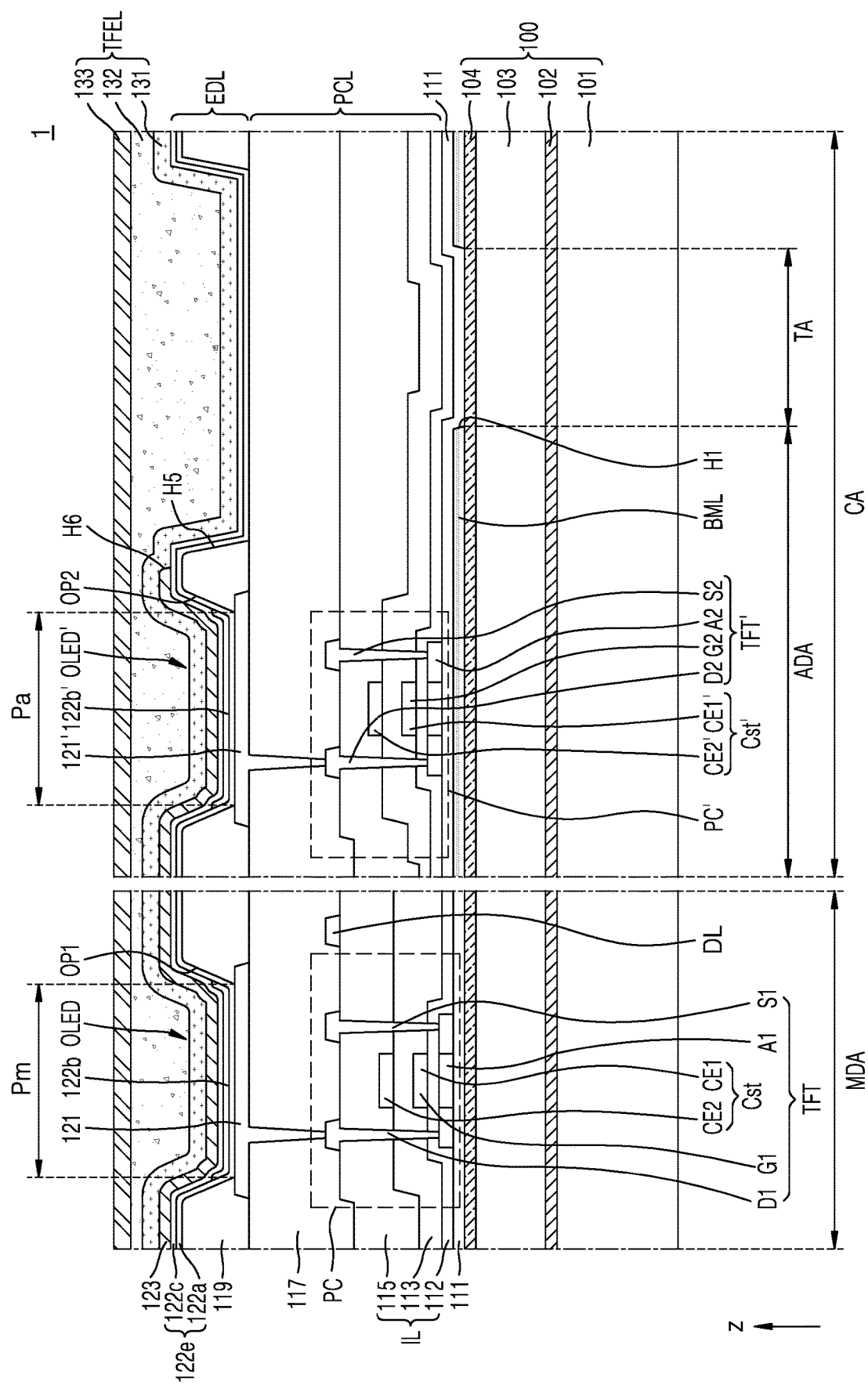

FIGS. 10 through 12 are schematic cross-sectional views of a portion of the display apparatus 1, according to embodiments of the present inventive concepts.

Referring to the embodiment of FIG. 10, the buffer layer 111 may be continually disposed in the transmission area TA and may not include the second hole H2 in the transmission area TA as shown in the embodiment of FIG. 9. The inorganic insulating layer IL, the planarization layer 117, and the pixel-defining layer 119 may respectively have the third hole H3, the fourth hole H4, and the fifth hole H5, which expose an upper surface of the buffer layer 111.

Since the buffer layer 111 is disposed in the transmission area TA, external moisture or foreign materials may be prevented from penetrating into components on the transmission area TA.

Referring to the embodiment of FIG. 11, the buffer layer 111 and the inorganic insulating layer IL may be continually disposed to extend within the transmission area TA and the second and third holes H2, H3 may not be included in the transmission area TA as shown in the embodiment of FIG. 9. In another embodiment, at least one of the first insulating layer 112, the second insulating layer 113, and the third insulating layer 115 may be continually disposed to extend within the transmission area TA and a third hole H3 may be formed in the layer(s) of the insulating layer IL to extend within the transmission area TA. The planarization layer 117 and the pixel-defining layer 119 may respectively have the fourth hole 114 and the fifth hole H5, which expose an upper surface of the inorganic insulating layer IL.

Since the buffer layer 111 and the inorganic insulating layer IL may be disposed on the transmission area TA, the loss of the planarization by the planarization layer 117 may be prevented.

Referring to the embodiment of FIG. 12, the buffer layer 111, the inorganic insulating layer IL, and the planarization layer 117 may be continually disposed to extend within the transmission area TA. The pixel-defining layer 119 may have the fifth hole H5 exposing an upper surface of the planarization layer 117. The fifth hole H5 may extend within the transmission area TA and a partial portion of the auxiliary display area ADA adjacent to the transmission area TA. However, embodiments of the present inventive concepts are not limited thereto. For example, in an embodiment, the pixel-defining layer 119 may also be continually disposed to extend within the transmission area TA.

Figure 13:
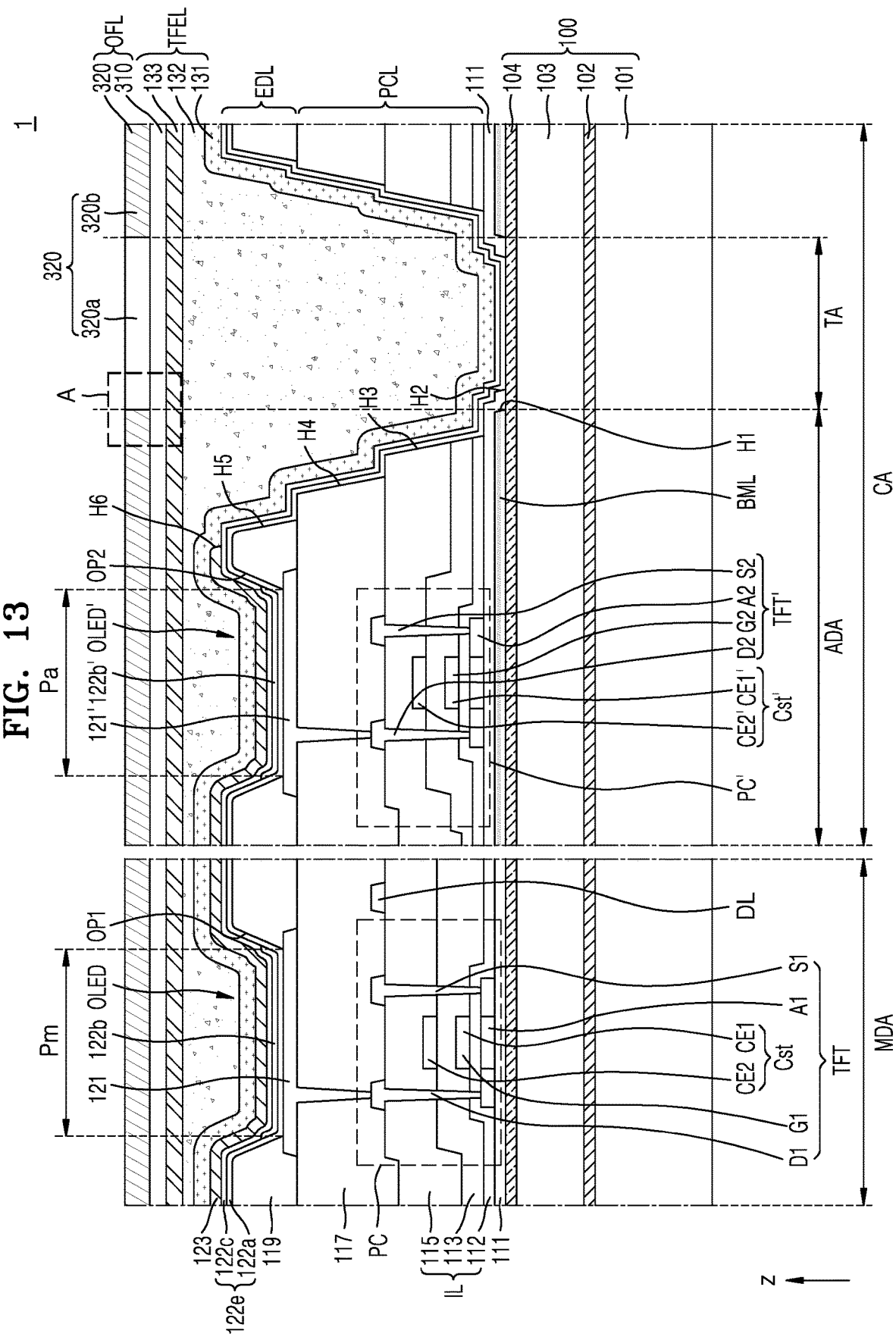
FIG. 13 is a cross-sectional view of a portion of a component area of a display apparatus according to an embodiment of the present inventive concepts.
Figure 14:
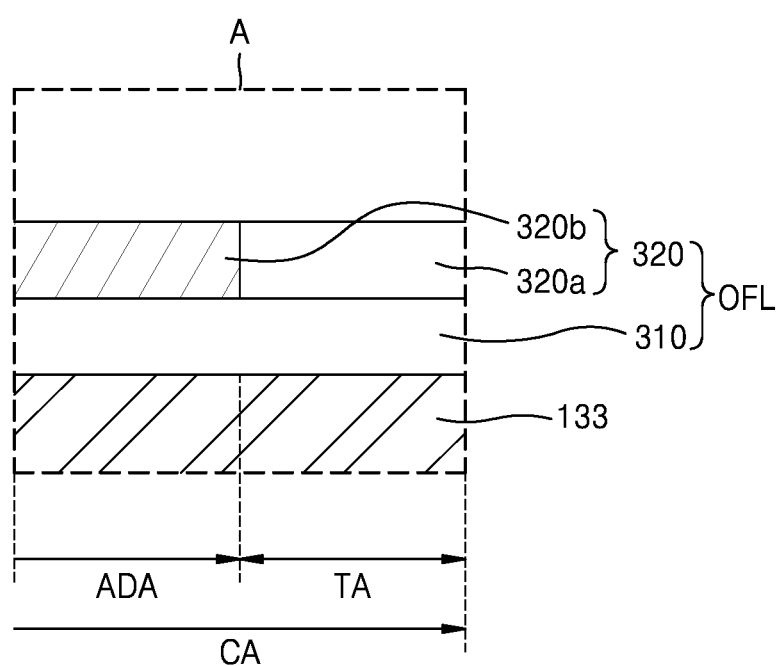
FIG. 14 is an enlarged view of region A of FIG. 13 according to an embodiment of the present inventive concepts.

FIG. 13 is a schematic cross-sectional view of a portion of the component area CA of the display apparatus 1 according to an embodiment, and FIG. 14 is an enlarged view of region A of FIG. 13. In FIG. 13, reference numerals that are the same as the reference numerals in FIG. 9 denote members that are the same as the members in FIG. 9, and thus, their descriptions will not be repeated.

Referring to the embodiments of FIGS. 13 and 14, the component area CA may include the auxiliary display area ADA in which the auxiliary sub-pixels Pa are arranged and the transmission area TA. The optical functional layer OFL may be disposed on the thin-film encapsulation layer TFEL. For example, as shown in the embodiment of FIG. 13, a lower surface of the optical functional layer OFL may directly contact an upper surface of the the thin-film encapsulation layer TFEL. As shown in the embodiments of FIGS. 13 and 14, the optical functional layer OFL may include a protection layer 310 and a polarization layer 320. The polarization layer 320 may include a first portion 320a disposed in the transmission area TA and a second portion 320b disposed in the auxiliary display area ADA. For example, the first portion 320a of the polarization layer 320 may be disposed in an entire portion of the transmission area TA and the second portion 320b may be disposed in an entire portion of the auxiliary display area ADA.

The protection layer 310 may be disposed on the thin-film encapsulation layer TFEL. For example, as shown in the embodiment of FIGS. 13 and 14, a lower surface of the protection layer 310 may directly contact an upper surface of the thin-film encapsulation layer TFEL, such as an upper surface of the second inorganic layer 133. The protection layer 310 may increase the mechanical strength of the polarization layer 320 by supporting the polarization layer 320 that is disposed above the protection layer 310. In an embodiment, the protection layer 310 may include at least one compound selected from cyclo olefin polymer, PMMA, etc. For example, the protection layer 310 may include tri-acetyl cellulose (TAC).

The polarization layer 320 may be disposed on the protection layer 310. For example, as shown in the embodiment of FIG. 13, a lower surface of the polarization layer 320 may directly contact an upper surface of the protection layer 310. The polarization layer 320 may polarize light that is incident from a light source and which extends in the same direction as a polarization axis. For example, in an embodiment, the polarization layer 320 may include a poly vinyl alcohol (PVA) film combined with a polarizer and/or a dichroic dye. In an embodiment, the dichroic dye may include iodine molecules and/or dye molecules.

For example, in an embodiment, the polarization layer 320 may be formed by extending a PVA film in a first direction which may be referred to as an "extension direction" and dipping the PVA film in a solution including iodine and/or a dichroic dye. In this embodiment, iodine molecules and/or dichroic dye molecules may be arranged in parallel in the extension direction. The iodine molecules and the dye molecules have dichroic properties, and thus, may absorb light oscillating in the extension direction and may allow light oscillating in a direction perpendicular to the extension direction to pass through the iodine molecules and the dye molecules.

The iodine included in the polarization layer 320 may function as an absorption element. Therefore, when the polarization layer 320 disposed in the transmission area TA includes iodine, the light transmittance of the transmission area TA may decrease due to absorption of the light by the polarization layer 320.

In a comparative embodiment, to increase the light transmittance of the transmission area TA, the polarization layer 320 may have an opening. However, the polarization layer 320 may be coupled onto the cover window 50 or the touch screen layer TSL is an adhesive, such as an OCA. Thus, in instances in which an inner portion of the opening is not completely filled with the OCA, bubbles may be generated which affect the transmission of light through the transmission area TA, and the encapsulation member exposed by the opening may be pressed which may damage the encapsulation member.

As shown in the embodiment of FIGS. 13-14, the polarization layer 320 may not have an opening and may extend continuously on the protection layer 310. A partial portion of the polarization layer 320, such as a portion disposed in the transmission area TA, may be bleached while the other portions of the polarization layer 320 are not bleached (e.g., unbleached). Thus, while the light transmittance of the transmission area TA may be increased, defects, due to bubbles, etc. may also be prevented.

As shown in the embodiment of FIG. 13, the polarization layer 320 may include the first portion 320a disposed in the transmission area TA and the second portion 320b disposed in the main display area MDA and the auxiliary display area ADA. The first portion 320a disposed in the transmission area TA may be the partial portion of the polarization layer 320 that is bleached. The first portion 320a of the polarization layer 320 is bleached and may have a greater light transmittance than the second portion 320b. While the embodiment shown in FIG. 13 shows the first portion 320a in the entire transmission area TA and the second portion in the entire main display area MDA and the auxiliary display area ADA, in other embodiments, the first portion 320a may be disposed in at least a partial portion of the transmission area TA and the second portion may be disposed in at least a partial portion of the main display area MDA and the auxiliary display area ADA.

For example, in an embodiment, the first portion 320a disposed in the transmission area TA may be bleached by an alkali material and neutralized by an acid solution. Thus, since the first portion 320a disposed in the transmission area TA is bleached by the alkali material, while each of the first portion 320a and the second portion 320b includes iodine, a content (e.g., concentration, etc.) of iodine in the first portion 320a may be less than a content of iodine in the second portion 320b. Since the content of iodine in the first portion 320a is decreased by bleaching, such as bleaching by the alkali material, the light transmittance of the transmission area TA may be increased.

In an embodiment, the first portion 320a and the second portion 320b of the polarization layer 320 may include boron. When the first portion 320a corresponding to the transmission area TA is bleached by the alkali material and neutralized by the acid solution, a cross-link bond of PVA of the first portion 320a of the polarization layer 320 may be released. Therefore, a content of boron in the first portion 320a may be less than a content of boron in the second portion 320b.

In an embodiment, the polarization layer 320 may include a phase delay layer. The phase delay layer may be disposed at a side of the polarization layer 320 and may delay a phase of light that is transmitted through the polarization layer 320 and polarized thereby. For example, the phase delay layer may delay the phase of light that is transmitted through the polarization layer by $\lambda/4$ to circularly polarize the light. Thus, the reflectivity of light may be reduced. In an embodiment, the phase delay layer may be disposed to be farther from a light source than the polarization layer 320. For example, when external light is incident from a position above the polarization layer 320, the phase delay layer may be disposed below the polarization layer 320.

Figure 15:
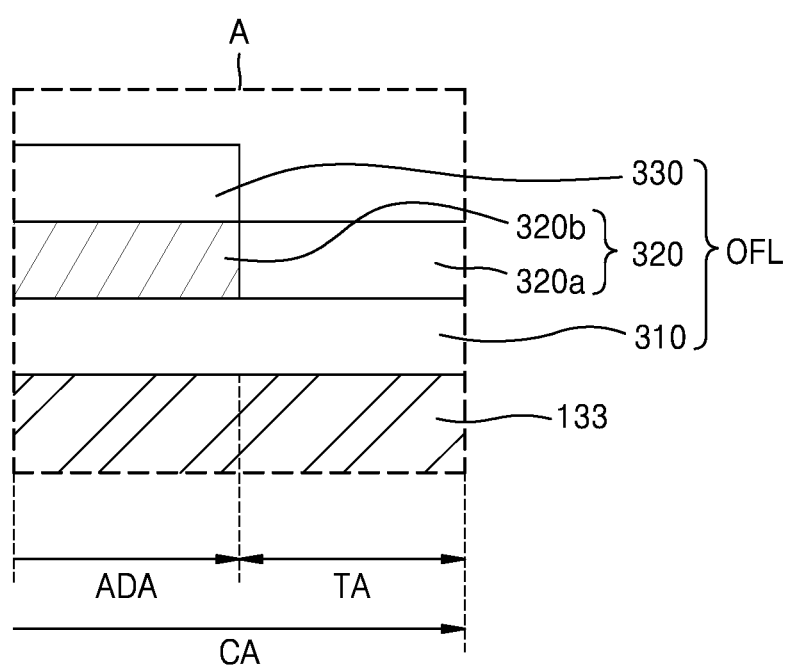
FIG. 15 is an enlarged view of region A of FIG. 13 according to an embodiment of the present inventive concepts.

FIG. 15 is an enlarged view of region A of FIG. 13. An embodiment illustrated in FIG. 15 is different from the embodiment illustrated in FIG. 14 in that a protection film 330 may further be disposed on the polarization layer 320. In FIG. 15, reference numerals that are the same as the reference numerals in FIG. 14 denote members that are the substantially the same as the members in FIG. 14, and thus, descriptions of the substantially similar elements will be omitted for convenience of explanation.

Referring to the embodiment of FIG. 15, the optical functional layer OFL may further include the protection film 330 disposed on the polarization layer 320. The protection film 330 may be arranged to protect the polarization layer 320. As shown in the embodiment of FIG. 15, a lower surface of the protection film 330 may directly contact an upper surface of the polarization layer 320. The protection film 330 may have an opening disposed to extend within the transmission area TA. For example, as shown in the embodiment of FIG. 15, the opening may overlap (e.g., in the z direction) the first portion 320a of the polarization layer 320. For example, the opening of the protection film 330 may overlap the entire first portion 320a.

Figure 16:
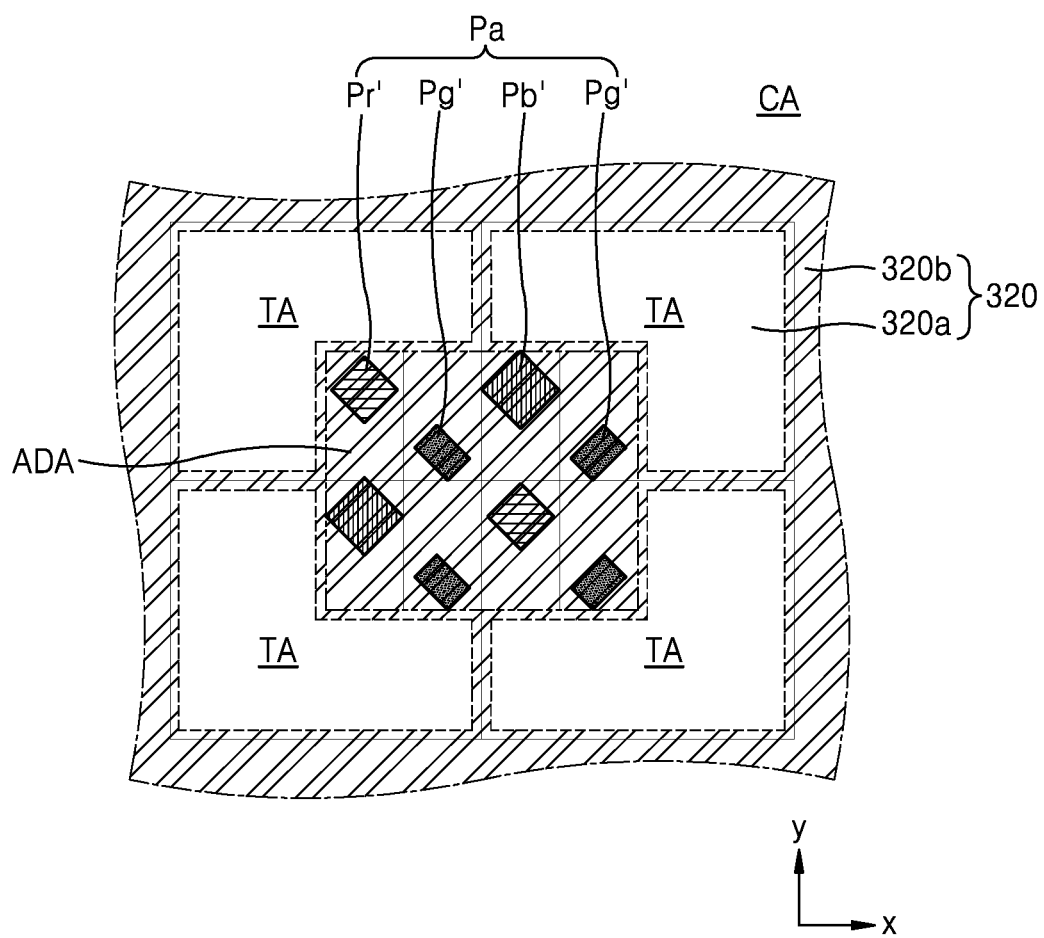
FIG. 16 is a plan view of a display apparatus according to an embodiment of the present inventive concepts.

FIG. 16 is a schematic plan view of a display apparatus according to an embodiment of the present inventive concepts.

Referring to the embodiment of FIG. 16, for example, the component area CA may include the auxiliary display area ADA in which the auxiliary sub-pixels Pa are arranged and the transmission area TA. The polarization layer 320 may include the first portion 320a and the second portion 320b. The first portion 320a of the polarization layer 320 may overlap the transmission area TA, and the second portion 320b of the polarization layer 320 may overlap the auxiliary display area ADA.

FIGS. 17 through 23 are schematic cross-sectional views of a method of manufacturing a display apparatus, according to embodiments of the present inventive concepts.

Hereinafter, the method of manufacturing the display apparatus is sequentially described with reference to the embodiments of FIGS. 17 through 23.

The method of manufacturing the display apparatus, according to an embodiment, may include: forming the thin-film encapsulation layer TFEL on the substrate 100 including the main display area MDA and the component area CA which includes the auxiliary display area ADA and the transmission area TA; forming a polarization material layer 320M on the thin-film encapsulation layer TFEL; forming a photoresist layer 510 on the polarization material layer 320M; exposing the photoresist layer 510; forming the polarization layer 320 including the first portion 320a disposed in the transmission area TA and the second portion 320b disposed in the main display area MDA and the auxiliary display area ADA by developing the photoresist layer 510 using a developing solution 530 and by bleaching the polarization material layer 320M; and applying an acid solution 540 onto the polarization layer 320.

Figure 17:
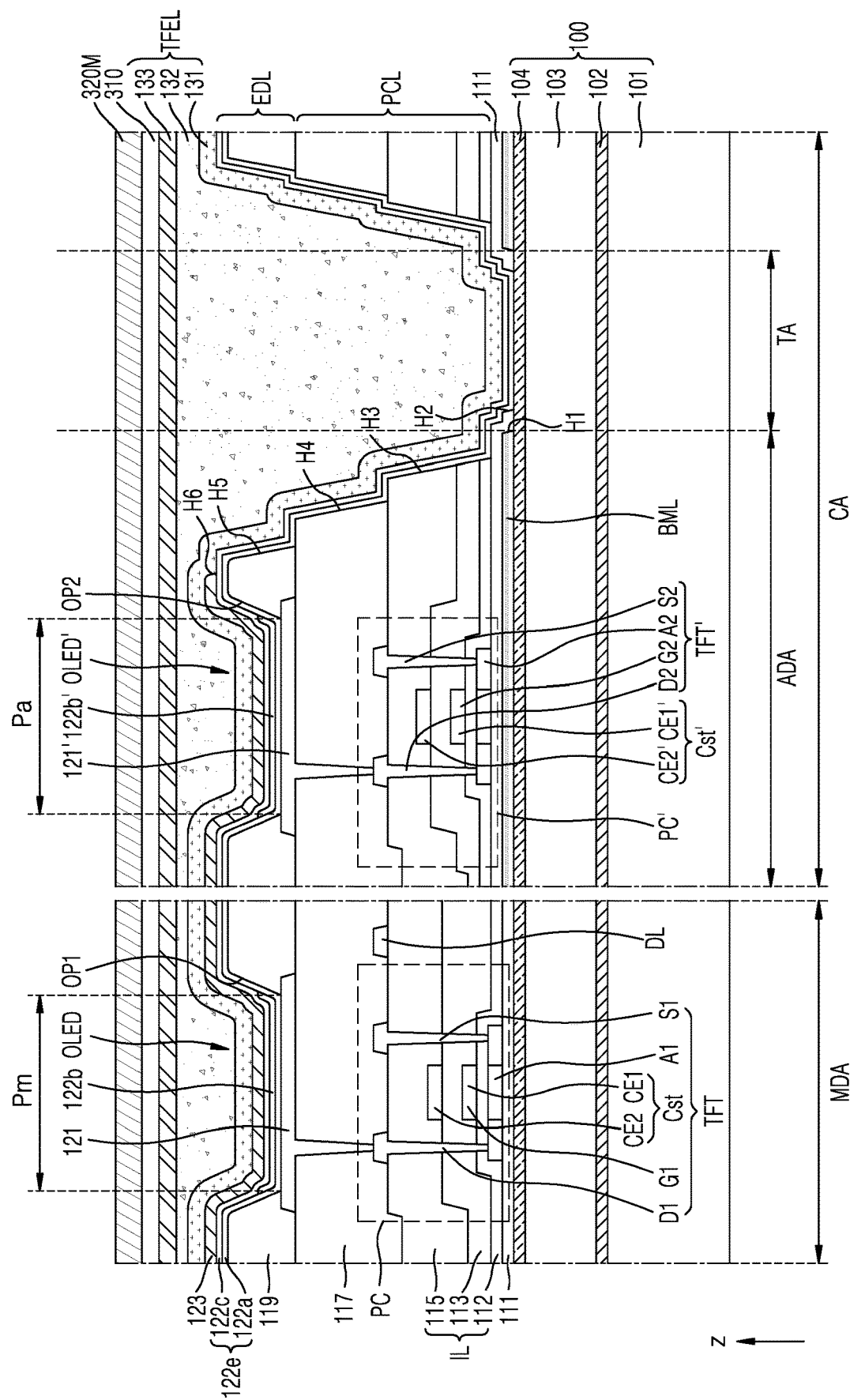
FIGS. 17 through 23 are cross-sectional views illustrating a method of manufacturing a display apparatus, according to embodiments of the present inventive concepts.

Referring to the embodiment of FIG. 17, the display apparatus may include the main display area MDA and the component area CA, and the component area CA may include the auxiliary display area ADA and the transmission area TA. As shown in the embodiment of FIG. 17, the main display area MDA may include the main sub-pixels Pm formed therein, and the component area CA may include the auxiliary display area ADA having auxiliary sub-pixels Pa formed therein.

The main pixel circuit PC including the main thin-film transistor TFT and the main storage capacitor Cst, and the main organic light-emitting diode OLED, which is a main display element connected to the main pixel circuit PC, may be formed in the main display area MDA. The auxiliary pixel circuit PC' including the auxiliary thin-film transistor TFT' and the auxiliary storage capacitor Cst', and the auxiliary organic light-emitting diode OLED', which is an auxiliary display element connected to the auxiliary pixel circuit PC', may be formed in the auxiliary display area ADA.

The thin-film encapsulation layer TFEL may be formed on the main organic light-emitting diode OLED and the auxiliary organic light-emitting diode OLED' disposed in the auxiliary display area ADA of the component area CA. The thin-film encapsulation layer TFEL may also be formed on the transmission area TA of the component area CA. As shown in the embodiment of FIG. 17, the thin-film encapsulation layer TFEL may include the first inorganic layer 131, the organic layer 132, and the second inorganic layer 133 stacked in the z direction. However, embodiments of the present inventive concepts are not limited thereto.

The protection layer 310 may be formed on the thin-film encapsulation layer TFEL, and the polarization material layer 320M may be formed on the protection layer 310. In an embodiment, the protection layer 310 may include a cyclo olefin polymer, PMMA, etc. For example, the protection layer 310 may include TAC.

In an embodiment, the polarization material layer 320M may include a PVA film combined with a polarizer and/or a dichroic dye. The dichroic dye may include iodine molecules and/or dye molecules.

Figure 18:
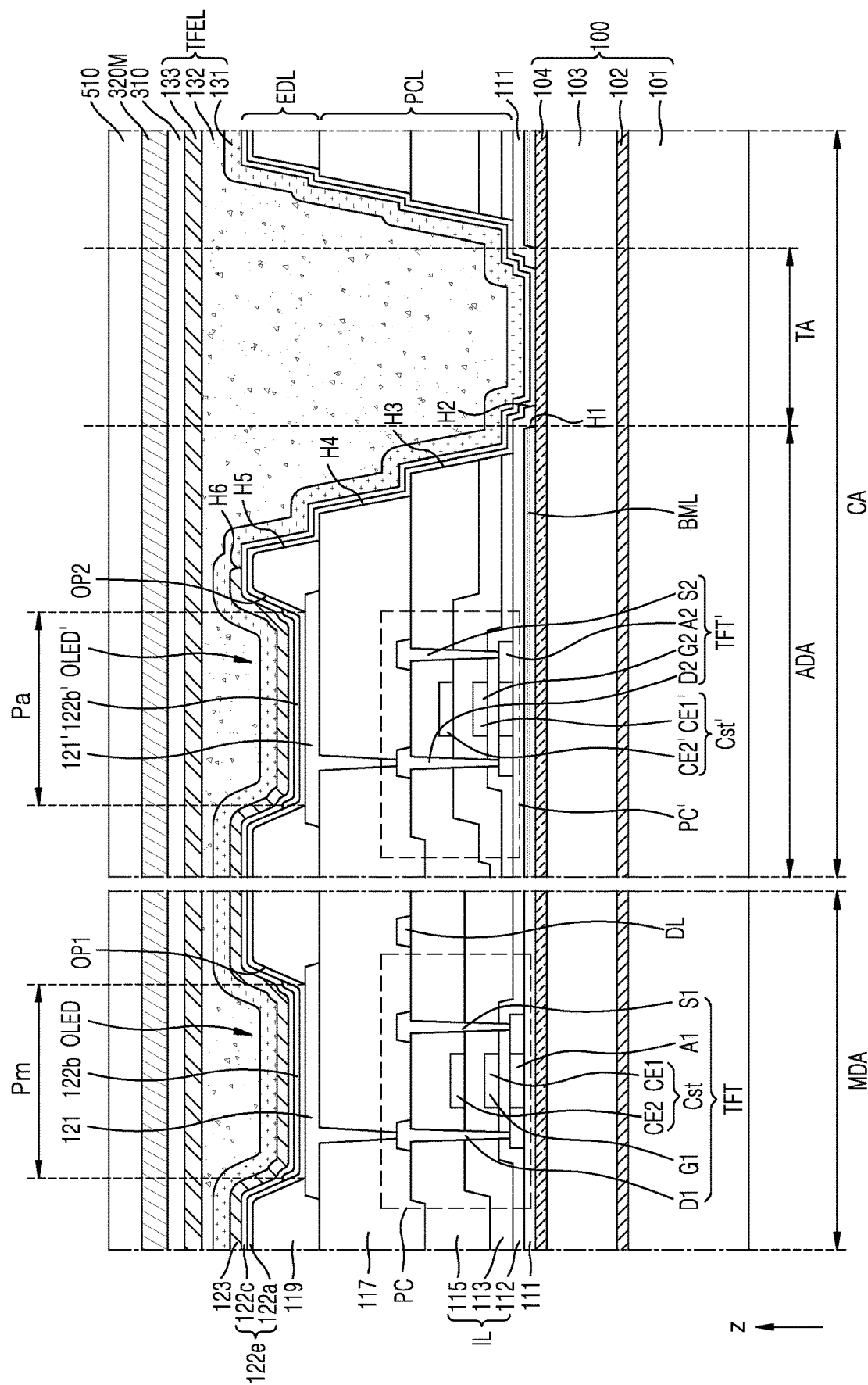

Referring to the embodiment of FIG. 18, after the forming of the protection layer 310 and the polarization material layer 320M on the thin-film encapsulation layer TFEL, the forming of the photoresist layer 510 on the polarization material layer 320M may be performed. For example, as shown in the embodiment of FIG. 18, a lower surface of the photoresist layer 510 may directly contact an upper surface of the polarization material layer 320M. In an embodiment, the photoresist layer 510 may include a positive photosensitive material. In another embodiment, the photoresist layer 510 may include a negative photosensitive material.

Figure 19:
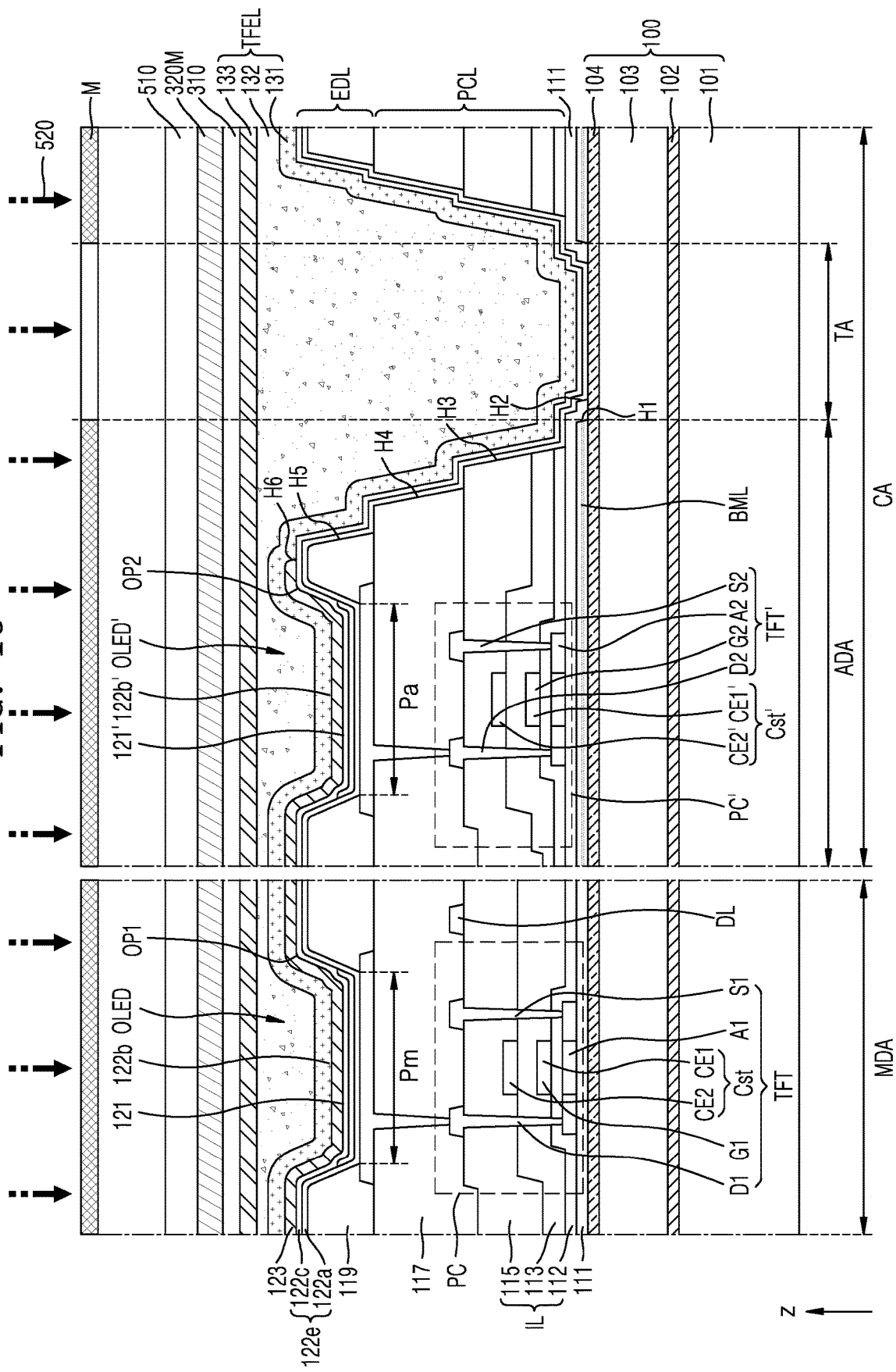
Figure 20:
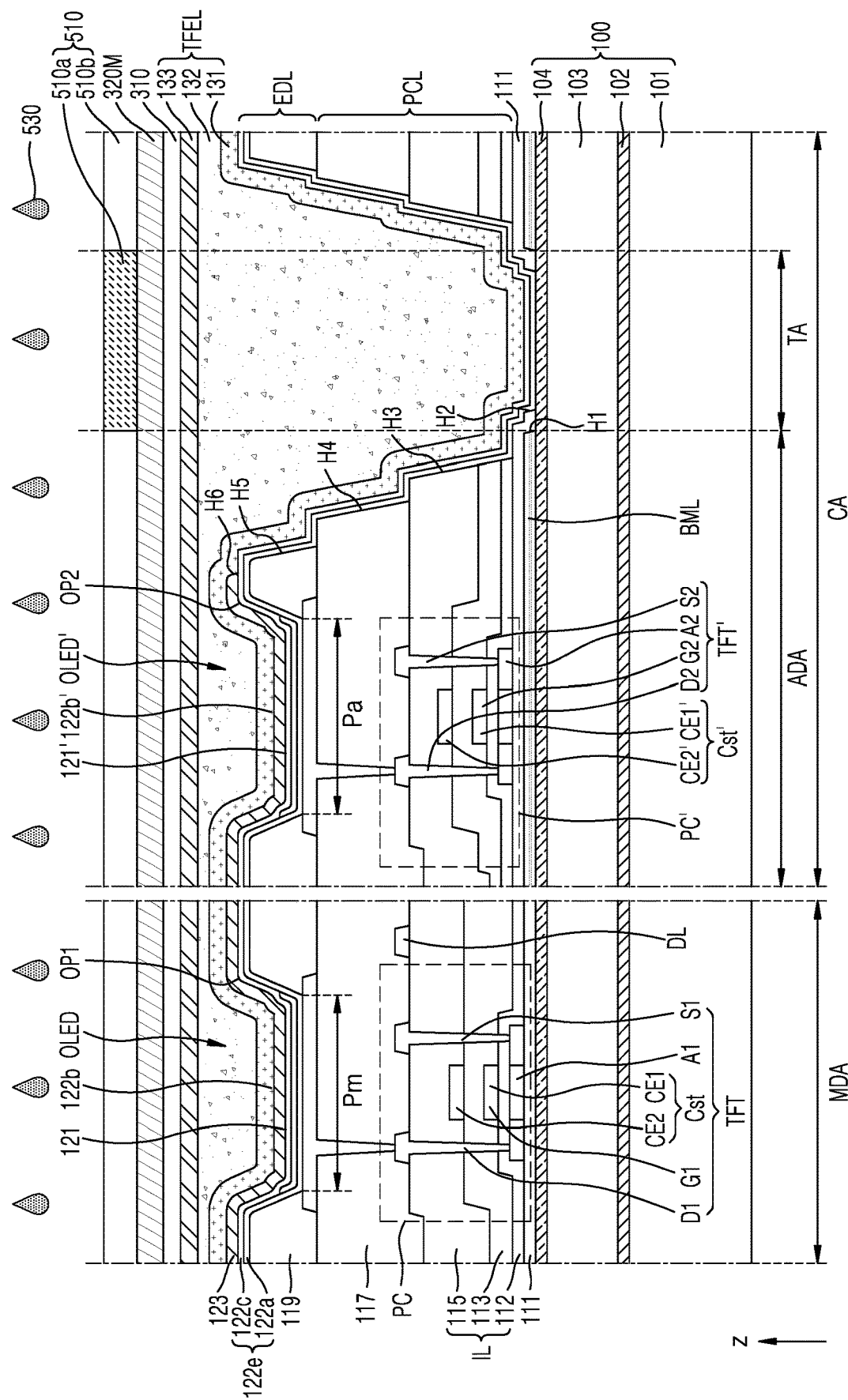

Referring to the embodiments of FIGS. 19 and 20, after the forming of the photoresist layer 510 on the polarization material layer 320M, the exposing of the photoresist layer 510 may be performed.

The exposing of the photoresist layer 510 may include exposing a partial portion of the photoresist layer 510 to light 520 by using a mask M. For example, as shown in the embodiment of FIG. 19, when the photoresist layer 510 includes a positive photosensitive material, a partial portion of the photoresist layer 510, such as the portion disposed in the transmission area TA, may be exposed to light 520. In another embodiment in which the photoresist layer 510 includes a negative photosensitive material, a partial portion of the photoresist layer 510, such as the partial portion disposed in all areas except the transmission area TA, may be exposed to the light 520.

As shown in the embodiment of FIG. 20a first portion 510a of the photoresist layer 510 which is the partial portion disposed in the transmission area TA may be exposed to the light, and a second portion 510b of the photoresist layer 510 which is the partial portion disposed in the other areas except for the transmission area TA may not be exposed. However, embodiments of the present inventive concepts are not limited thereto. For example, in another embodiment, the first portion 5110a of the photoresist layer 510 which is the partial portion disposed in the transmission area TA may not be exposed to the light 520 and the second portion 510b of the photoresist layer 510 which is the partial portion disposed in the other areas except for the transmission area TA may be exposed to the light 520.

After the exposing of the photoresist layer 510, the developing of the photoresist layer 510 and bleaching the polarization material layer 320M may be performed.

For example, the first portion 510a of the photoresist layer 510 which is the partial portion disposed in the transmission area TA may be exposed and developed via the developing solution 530. When the first portion 510a of the photoresist layer 510 that is disposed in the transmission area TA is developed, the polarization material layer 320M disposed below the first portion 510a of the photoresist layer 510 may be exposed and may be bleached via the developing solution 530.

Figure 21:
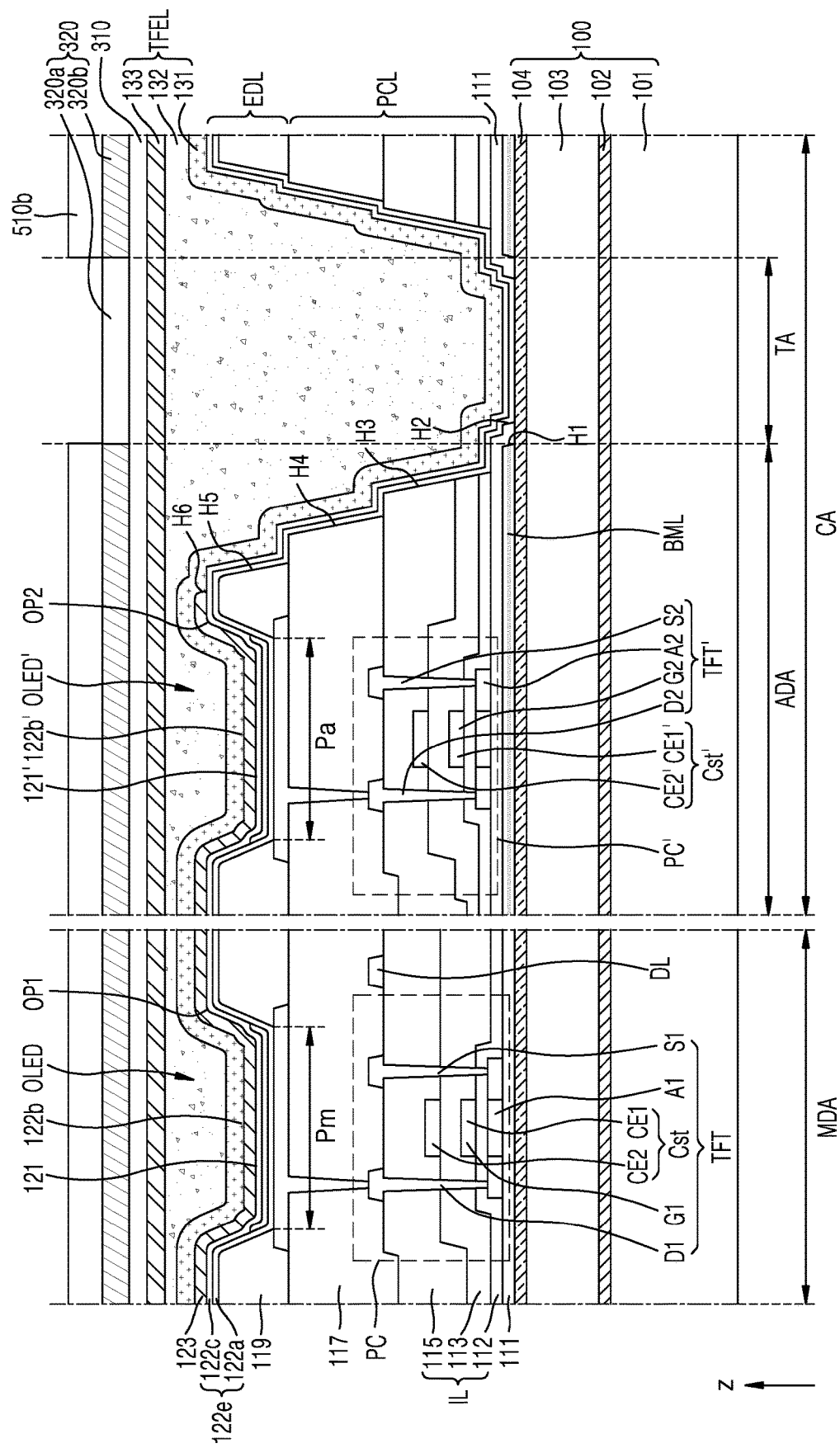

For example, as illustrated in FIG. 21, by exposing the photoresist layer 510 using the developing solution 530 and by bleaching the polarization material layer 320M below the photoresist layer 510, the polarization layer 320 including the first portion 320a corresponding to the transmission area TA and the second portion 320b corresponding to the main display area MDA and the auxiliary display area ADA may be formed. As shown in the embodiment of FIG. 21, the first portion 320a of the polarization layer 320 may correspond to the partial portion of the polarization material layer 320M that is bleached via the developing solution 530.

In an embodiment, the developing solution 530 may include an alkaline solution. After the developing solution 530 contacts an exposed surface of the partial portion of the polarization material layer 320M disposed in the transmission area TA, the developing solution 530 may penetrate into the polarization material layer 320M. An iodine complex included in the polarization material layer 320M may be reduced by the alkalinity of the alkaline solution included in the developing solution 530 and may become iodine ions. Since the iodine complex may be reduced to the iodine ions, the polarization performance of the partial portion of the polarization material layer 320M disposed in the transmission area TA may be substantially lost.

An alkaline material included in the developing solution 530 may include an arbitrary alkaline material. For example, in an embodiment, the alkaline material may include hydroxide of alkali metals, such as sodium hydroxide, potassium hydroxide, lithium hydroxide, hydroxide of alkaline earth metals, such as calcium hydroxide, inorganic alkali metal salt, such as sodium carbonate, organic alkali metal salt, such as sodium acetate, ammonia solution, etc. The alkaline material may include a homogeneous material or may include a mixture of two or more heterogeneous materials.

When the polarization layer 320 including the first portion 320a disposed in the transmission area TA and the second portion 320b disposed in the main display area MDA and the auxiliary display area ADA is formed by using the developing solution 530, a cross-link bond of PVA of the first portion 320a disposed in the transmission area TA may be released. Thus, while the first portion 320a and the second portion 320b include boron, a content of boron of the first portion 320a may be lower than a content of boron of the second portion 320b.

In an embodiment, in the forming of the polarization layer 320 including the first portion 320a corresponding to the transmission area TA and the second portion 320b corresponding to the main display area MDA and the auxiliary display area ADA by using the developing solution 530, the polarization material layer 320M may be bleached by the developing solution 530 for about five to twenty seconds. When the polarization material layer 320M is bleached for a time period that is less than about 5 seconds, there may be a large quantity of iodine complexes that is not reduced into iodine ions in the partial portion of the polarization material layer 320M disposed in the transmission area TA. Thus, the light transmittance of the transmission area TA may decrease. When the polarization material layer 320M is bleached for a time period that is greater than about 20 seconds, the developing solution 530 may be diffused into the partial portion of the polarization material layer 320M disposed in the auxiliary display area ADA. Thus, polarization performance of the auxiliary display area ADA may decrease.

Figure 22:
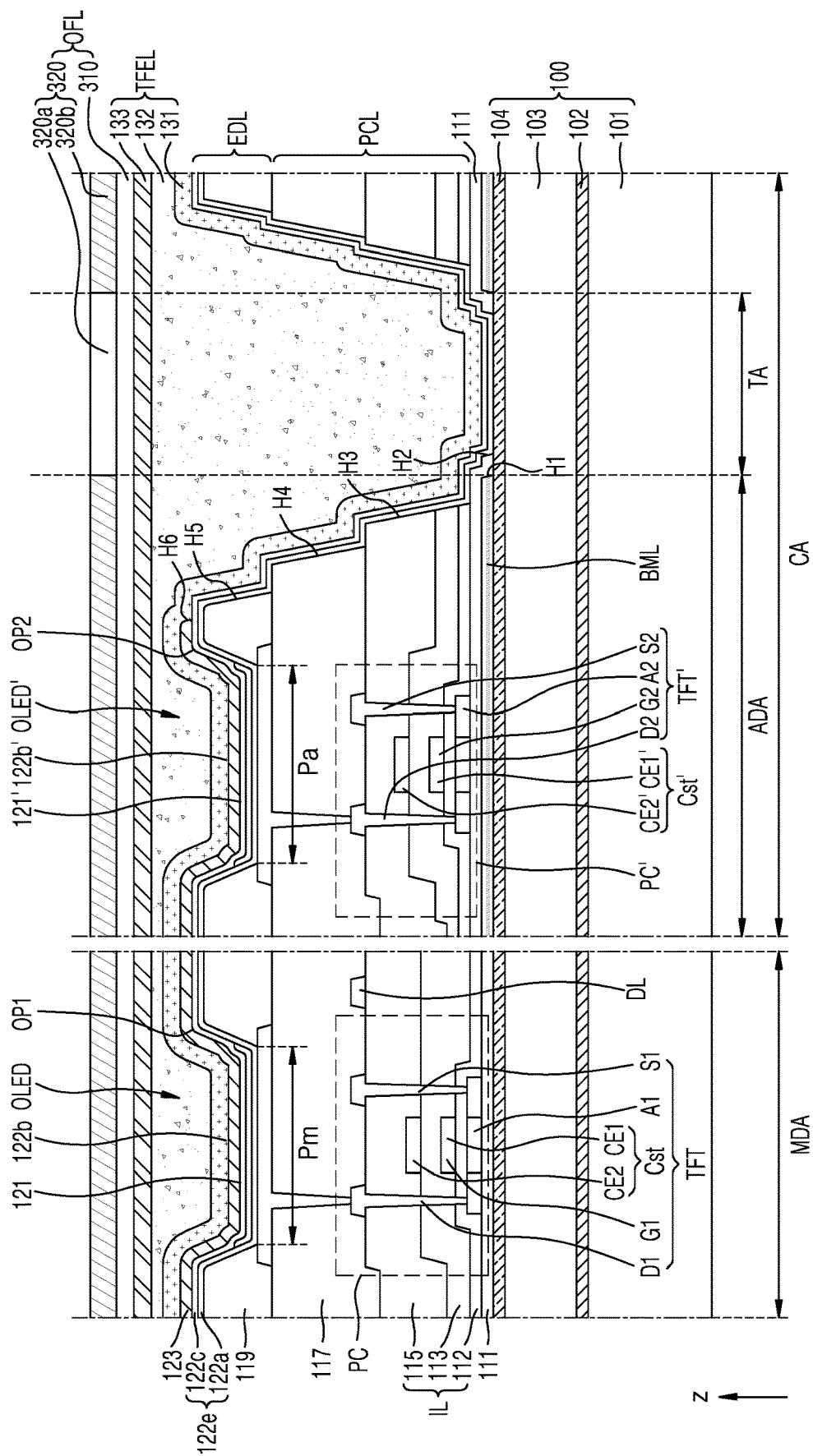
Figure 23:
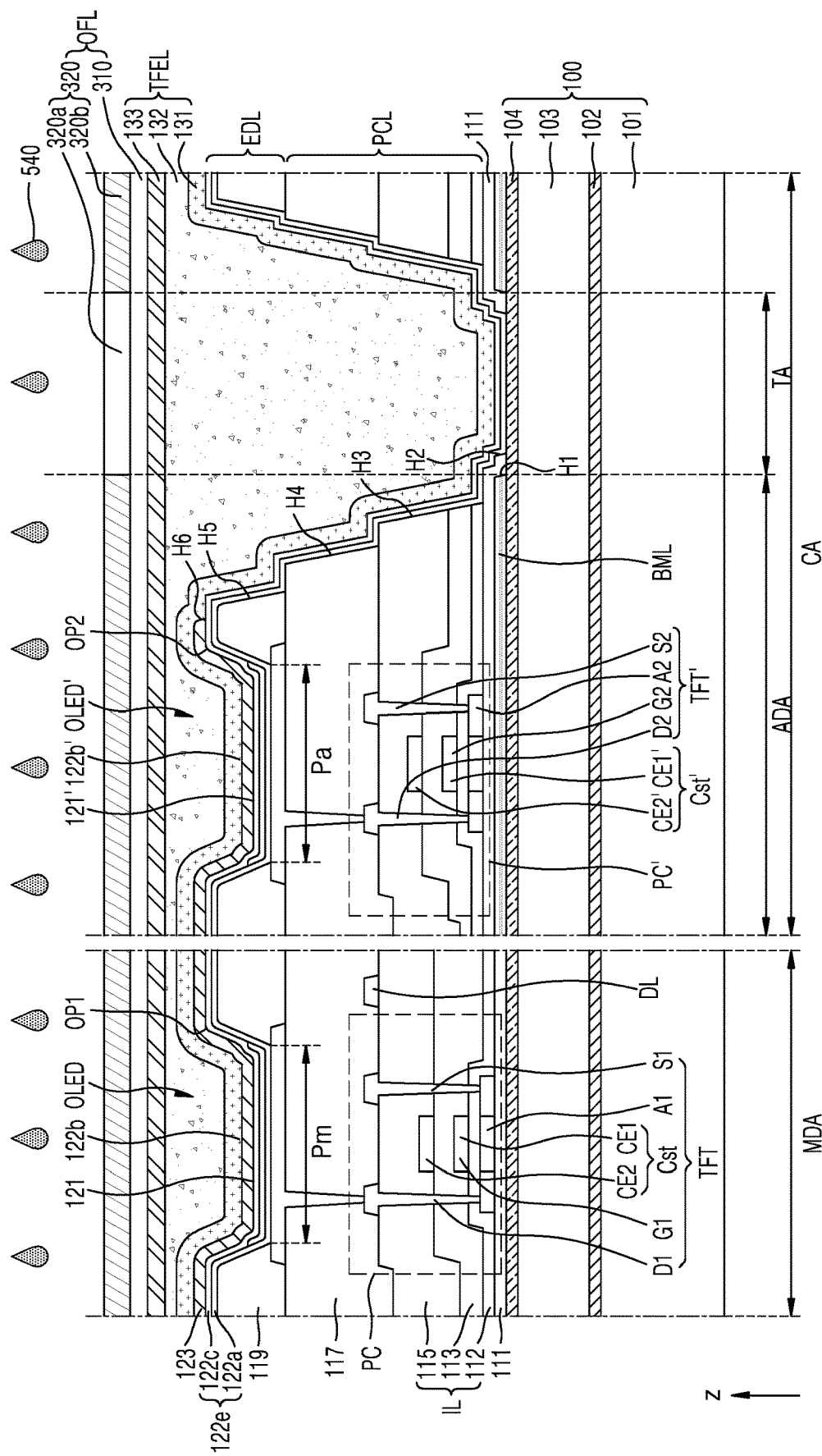

Referring to the embodiments of FIGS. 22 and 23, removing of the second portion S10b of the photoresist layer 510 may be performed, and after removing the second portion 510b of the photoresist layer 510, the applying of the acid solution 540 onto the polarization layer 320 may be performed. In another embodiment, before removing the second portion 510b of the photoresist layer 510, the acid solution 540 may be applied onto the second portion 510b of the photoresist layer 510 and the polarization layer 320.

By applying the acid solution 540 onto the polarization layer 320, the polarization layer 320 may be neutralized.

Based on the method of manufacturing the display apparatus described above, the optical functional layer OLF including the protection layer 310 and the polarization layer 320 may be formed in which the polarization layer 320 includes the first portion 320a disposed in the transmission area TA and the second portion 320b disposed in the main display area MDA and the auxiliary display area ADA.

The embodiments of FIGS. 18 through 23 illustrate that the optical functional layer OFL may be formed on the substrate 100 and the optical functional layer OFL includes the polarization layer 320 including the First portion 320a disposed in the transmission area TA and the second portion 320b disposed in the main display area MDA and the auxiliary display area ADA. However, embodiments of the present inventive concepts are not limited thereto. For example, in an embodiment, the optical functional layer OLF including the polarization layer 320 including the first portion 320a disposed in the transmission area TA and the second portion 320b disposed in the main display area MDA and the auxiliary display area ADA may be formed on the cover window 50 (see FIG. 2), and then, may be coupled onto the thin-film encapsulation layer TFEL via an adhesive layer, such as an OCA.

FIGS. 24 through 27 are schematic cross-sectional views for describing a method of manufacturing a display apparatus, according to embodiments of the present inventive concepts.

Referring to the embodiments of FIGS. 24 through 27, the method of manufacturing the display apparatus may include: forming the thin-film encapsulation layer TFEL on the substrate 100 including the main display area MDA and the component area CA, the component area CA including the auxiliary display area ADA and the transmission area TA; forming the polarization material layer 320M and the protection film 330 on the thin-film encapsulation layer TFEL; removing at least a portion of the protection film 330 by using a laser beam; forming the polarization layer 320 including the first portion 320a corresponding to the transmission area TA and the second portion 320b corresponding to the main display area MDA and the auxiliary display area ADA by applying an alkaline solution 610 onto the polarization material layer 320M; and applying an acid solution 620 onto the polarization layer 320.

Figure 24:
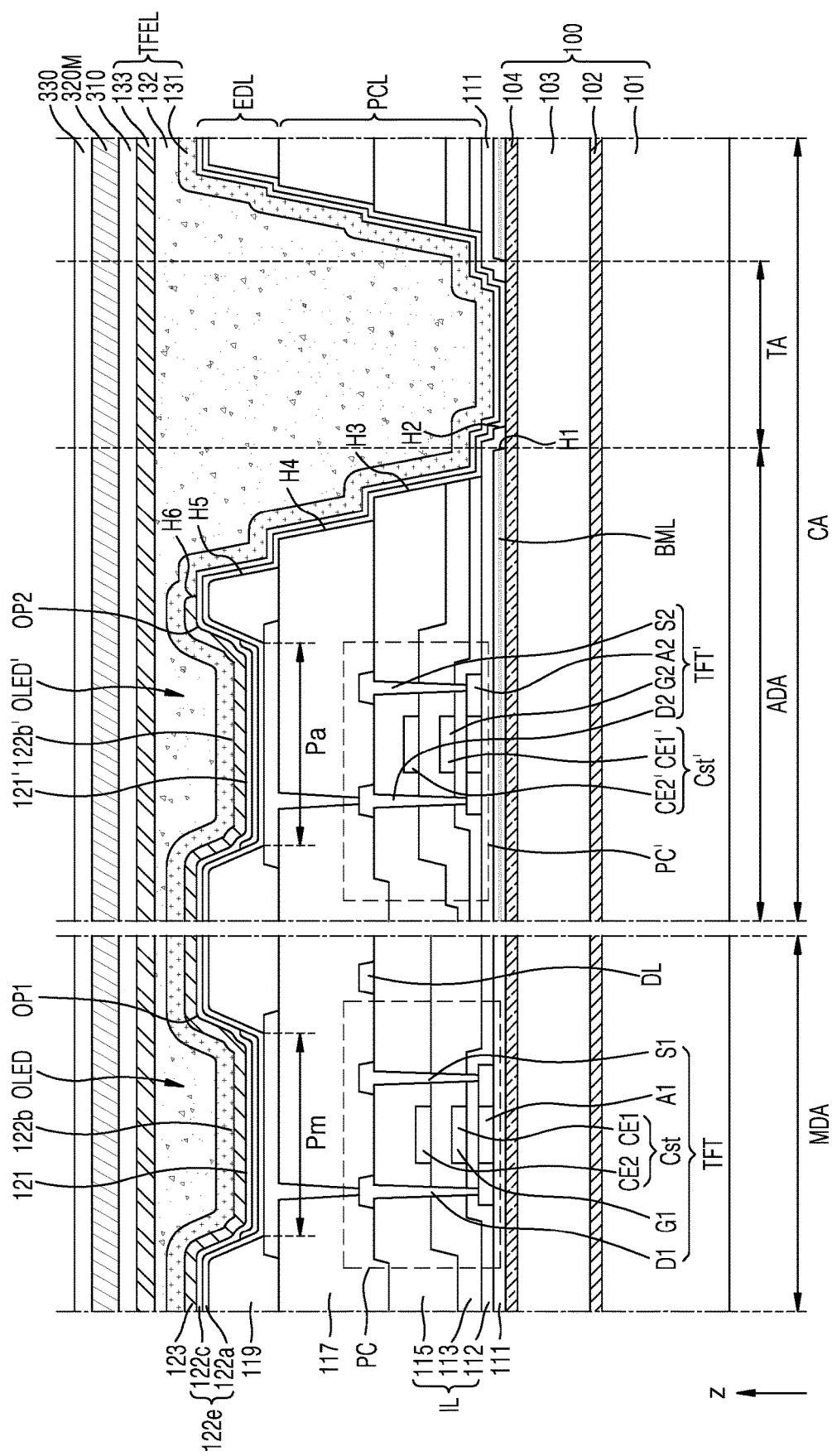
FIGS. 24 through 27 are cross-sectional views illustrating a method of manufacturing a display apparatus, according to an embodiment of the present inventive concepts.

Referring to the embodiment of FIG. 24, the protection layer 310, the polarization material layer 320M, and the protection film 330 may be formed on the thin-film encapsulation layer TFEL. In an embodiment, the protection layer 310 may include a cyclo olefin polymer, PMMA, etc. For example, the protection layer 310 may include TAC. The polarization material layer 320M may include a PVA film including a polarizer and/or a dichroic dye. The dichroic dye may include iodine molecules and/or dye molecules. The protection film 330 may be arranged to protect the polarization layer 320.

Figure 25:
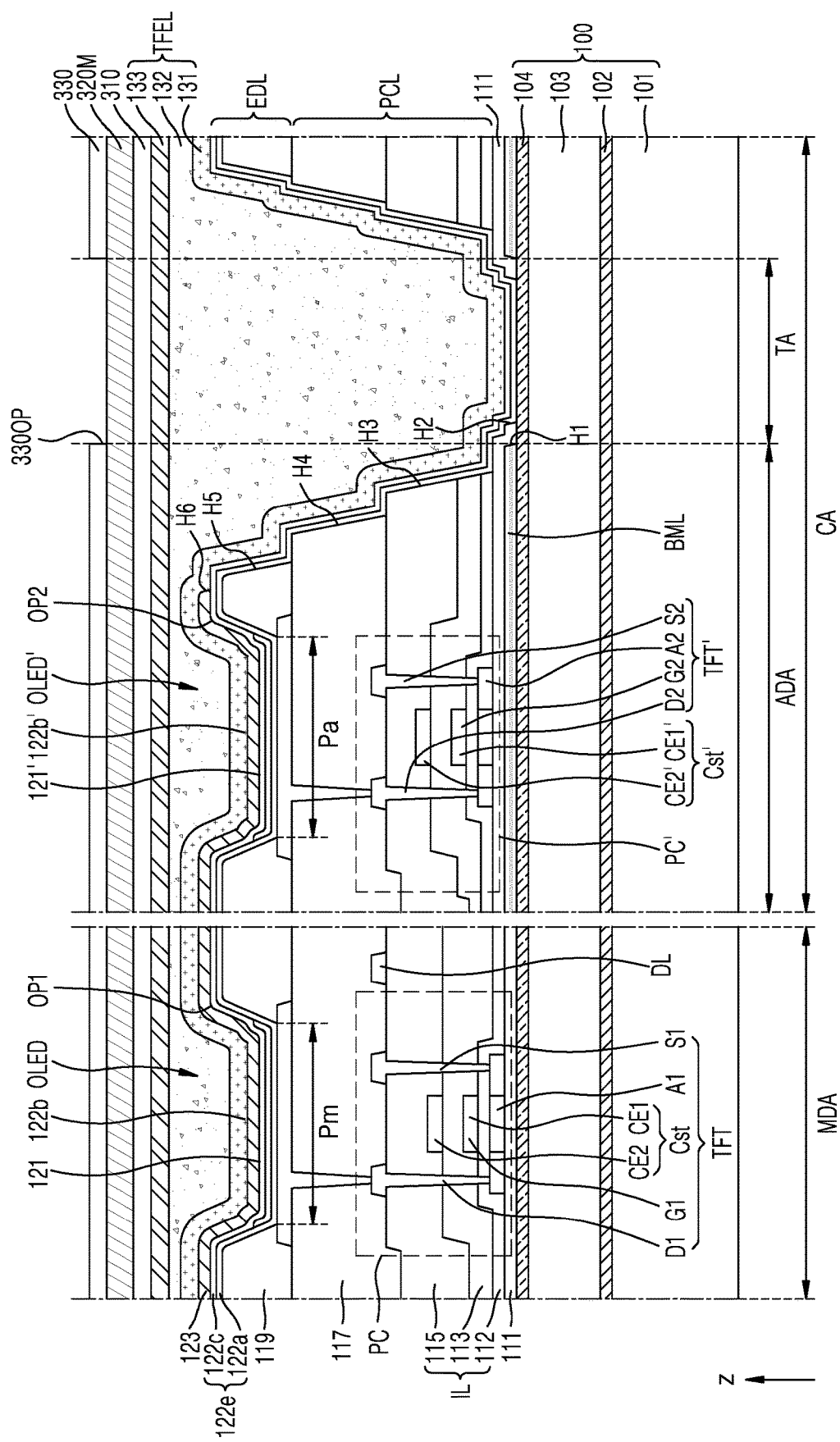

As illustrated in the embodiment of FIG. 25, after the forming of the protection layer 310, the polarization material layer 320M, and the protection film 330 on the thin-film encapsulation layer TFEL, the removing of the at least partial portion of the protection film 330 by using the laser beam may be performed.

The removing of the at least the portion of the protection film 330 by using the laser beam may include forming an opening 330OP disposed in the transmission area TA by removing the at least partial portion of the protection film 330 disposed in the transmission area TA using the laser beam.

Figure 26:
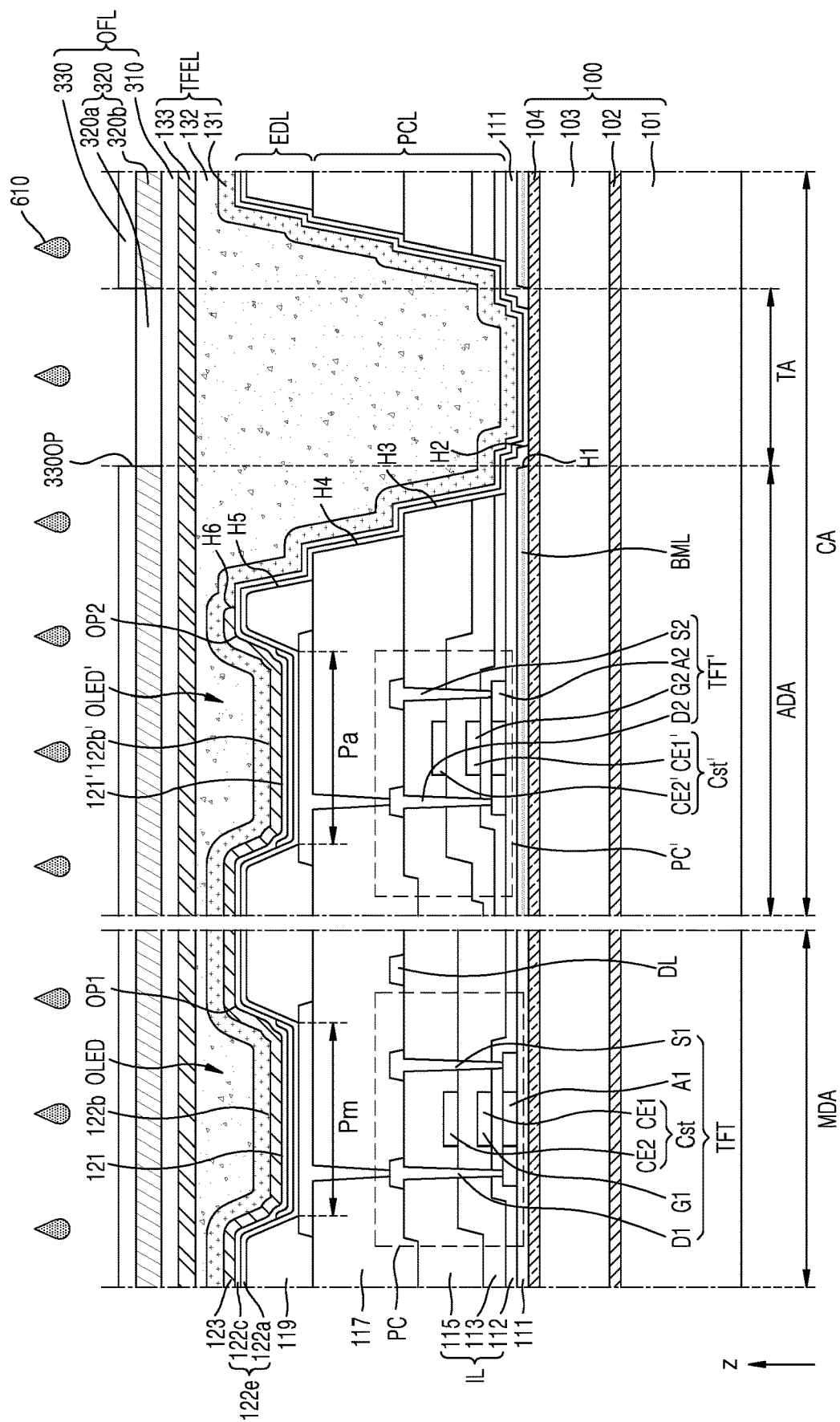

As illustrated in the embodiment of FIG. 26, after the removing of the at least partial portion of the protection film 330 by using the laser beam, the forming of the polarization layer 320 including the first portion 320a disposed in the transmission area TA and the second portion 320b disposed in the main display area MDA and the auxiliary display area ADA may be performed by applying the alkaline solution 610 on the polarization material layer 320M exposed by the opening 330OP.

In the forming of the polarization layer 320 including the first portion 320a disposed in the transmission area TA and the second portion 320b disposed in the main display area MDA and the auxiliary display area ADA by applying the alkaline solution 610 onto the polarization material layer 320M, the alkaline solution 610 may directly contact a surface of the polarization material layer 320M that is exposed by the opening 330OP and which is disposed in the transmission area TA. The alkaline solution 610 may then penetrate into the polarization material layer 320M. An iodine complex included in the polarization material layer 320M may be reduced by the alkalinity of the alkaline solution 610 and may become iodine ions. Since the iodine complex may be reduced to the iodine ions, the polarization performance of the portion of the polarization material layer 320M disposed in the transmission area TA may be substantially lost. Via these operations, the first portion 320a disposed in the transmission area TA may be bleached.

In an embodiment, the polarization material layer 320M may be bleached via the alkaline solution 610 in a range of about five to about twenty seconds. When the polarization material layer 320M is bleached for a time period that is less than about 5 seconds, there may be a large quantity of iodine complexes that is not reduced into iodine ions in the partial portion of the polarization material layer 320M disposed in the transmission area TA. Thus, the light transmittance of the transmission area TA may decrease. When the polarization material layer 320M is bleached for a time period that is greater than about 20 seconds, the developing solution 530 may be diffused into the partial portion of the polarization material layer 320M disposed in the auxiliary display area ADA. Thus, polarization performance of the auxiliary display area ADA may decrease.

Figure 27:
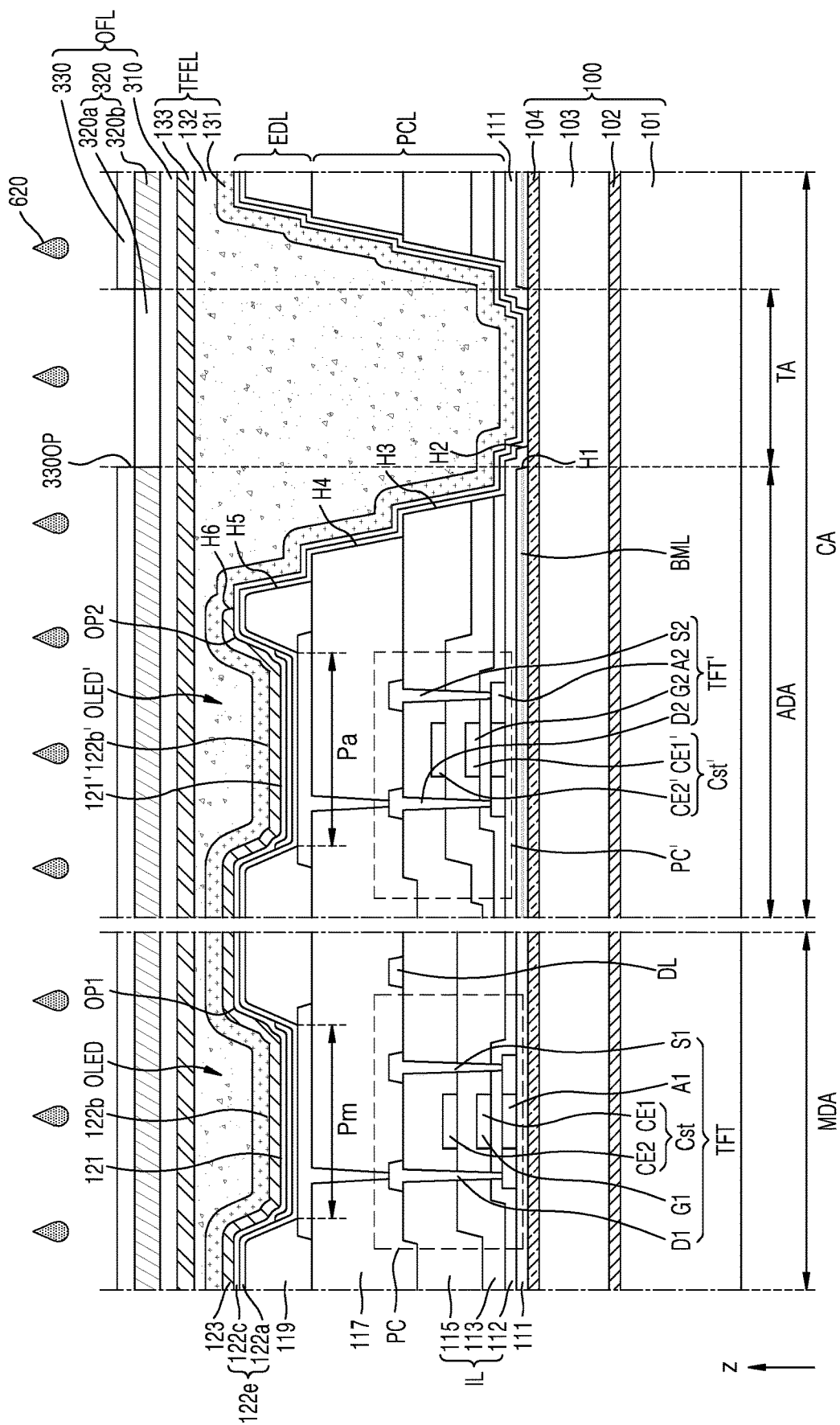

Thereafter, as illustrated in the embodiment of FIG. 27, the applying of the acid solution 620 onto the polarization layer 320 may be performed. For example, the applying of the acid solution 620 on the polarization layer 320 may include neutralizing the polarization layer 320 by applying the acid solution 620 onto the protection film 330 and the polarization layer 320.

As described above, according to the one or more of the above embodiments of the present inventive concepts, a partial portion of a polarization layer disposed in the transmission area may be bleached, and thus, the light transmittance of the transmission area may be increased. However, the scope of the present inventive concepts are not limited thereto.

It should be understood that embodiments of the present inventive concepts described herein should be considered in a descriptive sense only and not for purposes of limitation. Descriptions of features or aspects within each embodiment should typically be considered as available for other similar features or aspects in other embodiments. While one or more embodiments of the present inventive concepts have been described with reference to the figures, it will be understood by those of ordinary skill in the art that various changes in form and details may be made therein without departing from the spirit and scope of the present inventive concepts.

What is claimed is:

1. A display apparatus comprising:
    a substrate including a main display area and a component area, the component area including an auxiliary display area and a transmission area;
    main display elements disposed in the main display area;
    auxiliary display elements disposed in the component area, wherein the transmission area does not include the auxiliary display elements;
    a thin-film encapsulation layer covering the main display elements and the auxiliary display elements; and
    an optical functional layer disposed on the thin-film encapsulation layer and including a polarization layer,
    wherein the polarization layer includes a first portion disposed in the transmission area and a second portion disposed in the main display area and the auxiliary display area,
    wherein the polarization layer does not include any openings in the first portion, and
    wherein entireties of the first portion and the second portion are disposed on a same layer as each other.

2. The display apparatus of claim 1, wherein the first portion is bleached and the second portion is unbleached.

3. The display apparatus of claim 2, wherein:
    the first portion and the second portion each include iodine; and
    a content of the iodine included in the first portion is less than a content of the iodine included in the second portion.

4. The display apparatus of claim 3, wherein:
    the first portion and the second portion each include boron; and
    a content of the boron included in the first portion is less than a content of the boron included in the second portion.

5. The display apparatus of claim 4, wherein a light transmittance of the first portion is greater than a light transmittance of the second portion.

6. The display apparatus of claim 1, wherein the optical functional aver further includes a protection layer disposed below the polarization layer.

7. The display apparatus of claim 1, wherein the optical functional layer further includes a protection film disposed above the polarization layer, the protection film including an opening that extends within the transmission area.

8. The display apparatus of claim 1, further comprising a bottom metal layer arranged on the component area and having a first hole corresponding to the transmission area.

9. A display apparatus comprising:
a substrate including a main display area and a component area, the component area including a transmission area that does not include any display elements disposed therein,
a component disposed in the component area and comprising at least one electronic element selected from a camera, an illuminance sensor, a proximity sensor, an iris sensor, an audio sensor, a solar battery and a flash device;
a thin-film encapsulation layer covering the main display area and the component area; and
an optical functional aver disposed on the thin-film encapsulation layer and including a polarization layer,
wherein the polarization layer includes a first portion disposed in the transmission area and a second portion disposed in the main display area,
wherein the polarization layer does not include any openings in the first portion, and
wherein entireties of the first portion and the second portion are disposed on a same layer as each other.

10. The display apparatus of claim 9, wherein the component area further includes an auxiliary display area having auxiliary display elements disposed therein.

11. A method of manufacturing a display apparatus, the method comprising:
forming a thin-film encapsulation layer on a substrate that includes a main display area having main display elements and a component area, the component area including an auxiliary display area having auxiliary display elements and a transmission area that does not include the auxiliary display elements disposed therein;
forming a polarization material layer on the thin-film encapsulation layer;
forming a photoresist layer on the polarization material layer;
exposing a partial portion of the photoresist layer to light;
forming a polarization layer including a first portion disposed in the transmission area and a second portion disposed in the main display area and the auxiliary display area by developing the photoresist layer using a developing solution and by bleaching the first portion of the polarization material layer; and
applying an acid solution onto the polarization layer,
wherein the polarization layer does not include any openings in the first portion, and
wherein entireties of the first portion and the second portion are disposed on a same layer as each other.

12. The method of claim 11, wherein the developing solution includes an alkaline material.

13. The method of claim 12, wherein the first portion is bleached by the developing solution and the second portion is not bleached by the developing solution.

14. The method of claim 13, wherein:
the first portion and the second portion each include iodine; and
a content of the iodine included in the first portion is less than a content of the iodine included in the second portion.

15. The method of claim 14, wherein:
the first portion and the second portion each include boron; and
a content of the boron included in the first portion is less than a content of the boron included in the second portion.

16. The method of claim 15, wherein a light transmittance of the first portion is greater than a light transmittance of the second portion.

17. The method of claim 11, wherein the applying of the acid solution onto the polarization layer is configured to neutralize the polarization layer.

18. A method of manufacturing a display apparatus, the method comprising:
forming a thin-film encapsulation layer on a substrate including a main display area and a component area, the component area including an auxiliary display area and a transmission area;
forming a polarization material layer and a protection film on the thin-film encapsulation layer, wherein the protection film is disposed directly on the polarization material layer;
removing at least a partial portion of the protection film by using a laser beam to form an opening in the protection film;
forming a polarization layer including a first portion disposed in the transmission area and a second portion disposed in the main display area and the auxiliary display area by applying an alkaline solution on the polarization material layer exposed by the opening; and
applying an acid solution on the polarization layer,
wherein the polarization layer does not include any openings in the first portion, and
wherein entireties of the first portion and the second portion are disposed on a same layer as each other.

19. The method of claim 18, wherein the first portion is bleached via the alkaline solution.

20. The method of claim 19, wherein:
the first portion and the second portion each include iodine; and
a content of the iodine included in the first portion is less than a content of the iodine included in the second portion.

21. The method of claim 18, wherein the removing of the at least the partial portion of the protection film includes removing a portion of the protection film disposed in the transmission area.

22. A method of manufacturing a display apparatus, the method comprising:
forming a thin-film encapsulation layer on a substrate that includes a main display area and a component area, the component area including a transmission area that does not include any display elements disposed therein;
forming a polarization material layer on the thin-film encapsulation layer;
forming a photoresist layer on the polarization material layer;
exposing a partial portion of the photoresist layer to light;
forming a polarization layer including a first portion disposed in the transmission area and a second portion disposed in the main display area by developing the photoresist layer using a developing solution and by bleaching the first portion of the polarization material layer; and
applying an acid solution onto the polarization layer,
wherein the polarization layer does not include any openings in the first portion, and
wherein entireties of the first portion and the second portion are disposed on a same layer as each other.

23. A display apparatus comprising:
a substrate including a main display area and a component area, the component area including a transmission area that does not include any display elements;

an optical functional layer including a polarization layer disposed on display elements disposed in the main display area, the polarization layer extending continuously on the main display area and the component area;

wherein the polarization layer includes a first portion that is bleached and a second portion that is unbleached, the first portion is disposed in the transmission area, wherein the polarization layer does not include any openings in the first portion, and wherein entireties of the first portion and the second portion are disposed on a same layer as each other.

* * * * *